United States Patent
Kim et al.

(10) Patent No.: US 11,871,623 B2
(45) Date of Patent: Jan. 9, 2024

(54) DISPLAY DEVICE AND METHOD OF MANUFACTURING THE SAME

(71) Applicant: Samsung Display Co., LTD., Yongin-si (KR)

(72) Inventors: Jungi Kim, Hwaseong-si (KR); Jin-Su Byun, Seoul (KR); Jaehun Lee, Seongnam-si (KR); Bogeon Jeon, Hwaseong-si (KR); Yang-Ho Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 133 days.

(21) Appl. No.: 17/024,609

(22) Filed: Sep. 17, 2020

(65) Prior Publication Data
US 2021/0167151 A1 Jun. 3, 2021

(30) Foreign Application Priority Data
Dec. 3, 2019 (KR) ........................ 10-2019-0159054

(51) Int. Cl.
| | |
|---|---|
| *H01L 27/32* | (2006.01) |
| *H01L 51/56* | (2006.01) |
| *H10K 59/124* | (2023.01) |
| *H10K 50/858* | (2023.01) |
| *H10K 59/40* | (2023.01) |

(Continued)

(52) U.S. Cl.
CPC ......... *H10K 59/124* (2023.02); *G06F 3/0412* (2013.01); *G06F 3/0446* (2019.05); *G06V 40/1318* (2022.01); *H10K 50/858* (2023.02); *H10K 59/122* (2023.02); *H10K 59/40* (2023.02);

(Continued)

(58) Field of Classification Search
CPC . H01L 27/323; H01L 27/5275; H01L 27/322; H01L 27/14678; H10K 50/858; H10K 59/879; H10K 59/40; G06F 3/00; G06V 40/1318
See application file for complete search history.

(56) References Cited

U.S. PATENT DOCUMENTS

| | | | | |
|---|---|---|---|---|
| 3,822,928 A | * | 7/1974 | Smolinsky ............. | C08G 85/00 427/160 |
| 8,618,730 B2 | * | 12/2013 | Park ....................... | H05B 33/10 313/506 |

(Continued)

FOREIGN PATENT DOCUMENTS

| | | |
|---|---|---|
| KR | 10-2017-0050139 | 5/2017 |
| KR | 10-2018-0070218 | 6/2018 |

(Continued)

OTHER PUBLICATIONS

Machine translation, Kim, Korean Pat. Pub. No. KR20200080611-A, translation date: Jul. 16, 2022, Espacenet, all pages. (Year: 2022).*

*Primary Examiner* — Victoria K. Hall
(74) *Attorney, Agent, or Firm* — H.C. Park & Associates, PLC

(57) ABSTRACT

A display device includes a display panel including a plurality of light emitting areas; and an input sensor disposed on the display panel and having a first conductive layer and a first insulating layer disposed on the first conductive layer. The first insulating layer includes a plurality of optical patterns that extend in a direction away from the first conductive layer.

22 Claims, 14 Drawing Sheets

(51) Int. Cl.
*H10K 59/122* (2023.01)
*H10K 71/00* (2023.01)
*G06F 3/044* (2006.01)
*G06V 40/13* (2022.01)
*G06F 3/041* (2006.01)

(52) U.S. Cl.
CPC .... *H10K 71/00* (2023.02); *G06F 2203/04112* (2013.01)

(56) References Cited

U.S. PATENT DOCUMENTS

| | | | |
|---|---|---|---|
| 10,388,913 B2 | 5/2019 | Jung et al. | |
| 10,468,626 B2 | 11/2019 | Lee et al. | |
| 10,553,827 B2 * | 2/2020 | Jang | H01L 27/322 |
| 10,727,444 B2 * | 7/2020 | Byun | G02B 27/0172 |
| 11,005,076 B2 * | 5/2021 | Lee | H01L 51/5253 |
| 11,038,151 B2 * | 6/2021 | Ju | H01L 27/322 |
| 11,056,546 B2 * | 7/2021 | Jung | H01L 51/5275 |
| 11,217,777 B2 * | 1/2022 | An | H01L 51/5253 |
| 11,258,049 B2 * | 2/2022 | Kim | H01L 27/323 |
| 11,271,054 B2 * | 3/2022 | Lee | H01L 51/5284 |
| 11,276,838 B2 * | 3/2022 | Kim | H10K 50/8445 |
| 2009/0215281 A1 * | 8/2009 | Mungekar | H01L 27/14627 257/E21.271 |
| 2013/0063022 A1 * | 3/2013 | Park | H05B 33/04 313/504 |
| 2014/0027725 A1 * | 1/2014 | Lim | H01L 27/322 257/40 |
| 2014/0167006 A1 * | 6/2014 | Kim | B29C 59/046 264/293 |
| 2017/0278899 A1 * | 9/2017 | Yang | G06F 3/0412 |
| 2018/0150671 A1 | 5/2018 | Choo et al. | |
| 2018/0175116 A1 | 6/2018 | Song et al. | |
| 2018/0350883 A1 * | 12/2018 | Lee | G06F 3/0443 |
| 2019/0004654 A1 | 1/2019 | Gwon et al. | |
| 2019/0051711 A1 * | 2/2019 | Lee | H01L 51/5284 |
| 2019/0221779 A1 * | 7/2019 | Jang | H01L 27/323 |
| 2019/0251318 A1 * | 8/2019 | Jung | H01L 27/3234 |
| 2020/0066804 A1 * | 2/2020 | Jung | H01L 51/5284 |
| 2020/0067020 A1 * | 2/2020 | Byun | H01L 51/5256 |
| 2020/0119113 A1 * | 4/2020 | Lee | G06F 3/0446 |
| 2020/0144550 A1 * | 5/2020 | Lee | H01L 51/5281 |
| 2020/0161395 A1 * | 5/2020 | Kim | H01L 27/323 |
| 2020/0194728 A1 * | 6/2020 | Kim | H01L 51/5253 |
| 2020/0201033 A1 * | 6/2020 | Song | G02B 5/045 |
| 2020/0210005 A1 * | 7/2020 | Kim | G06F 3/0446 |
| 2020/0227489 A1 * | 7/2020 | Kim | H01L 51/5275 |
| 2020/0243802 A1 * | 7/2020 | Ju | H01L 27/3272 |
| 2020/0259123 A1 * | 8/2020 | Yang | H01L 51/56 |
| 2020/0335723 A1 * | 10/2020 | Yuan | H01L 51/5268 |
| 2020/0350516 A1 * | 11/2020 | An | H01L 27/3244 |
| 2020/0388654 A1 * | 12/2020 | Lee | H01L 51/5284 |
| 2020/0388789 A1 * | 12/2020 | Cha | H01L 27/323 |
| 2021/0005845 A1 * | 1/2021 | Kim | G06F 3/0412 |
| 2021/0013452 A1 * | 1/2021 | Kim | G06F 3/0412 |
| 2021/0020865 A1 * | 1/2021 | Kim | H01L 51/5072 |
| 2021/0063811 A1 * | 3/2021 | Wang | H01L 27/3272 |
| 2021/0083012 A1 * | 3/2021 | Byun | H01L 51/5275 |
| 2021/0098746 A1 * | 4/2021 | Guo | H01L 27/3206 |
| 2021/0126227 A1 * | 4/2021 | Choi | H10K 59/40 |
| 2021/0135166 A1 * | 5/2021 | Baek | H01L 27/323 |
| 2021/0159280 A1 * | 5/2021 | Ye | H01L 51/56 |
| 2021/0181879 A1 * | 6/2021 | Kim | H01L 51/5275 |
| 2021/0202917 A1 * | 7/2021 | Lee | H01L 27/3246 |
| 2021/0391558 A1 * | 12/2021 | Kim | G06F 3/0445 |
| 2022/0077431 A1 * | 3/2022 | Lee | H01L 51/5275 |
| 2022/0123264 A1 * | 4/2022 | Choi | G06F 3/0412 |
| 2022/0123269 A1 * | 4/2022 | An | H01L 51/5275 |
| 2023/0023465 A1 * | 1/2023 | Choi | G06F 3/0443 |
| 2023/0113069 A1 * | 4/2023 | Baek | H10K 59/122 257/91 |

FOREIGN PATENT DOCUMENTS

| | | | | |
|---|---|---|---|---|
| KR | 10-2019-0003181 | | 1/2019 | |
| KR | 10-2019-0062678 | | 6/2019 | |
| KR | 10-2020-0080611 A | * | 7/2020 | ........... H01L 27/323 |
| KR | 10-2020-0119455 | | 10/2020 | |

* cited by examiner

DISPLAY DEVICE AND METHOD OF MANUFACTURING THE SAME

CROSS-REFERENCE TO RELATED APPLICATION

This application claims priority from and the benefit of Korean Patent Application No. 10-2019-0159054, filed on Dec. 3, 2019, which is hereby incorporated by reference for all purposes as if fully set forth herein.

BACKGROUND

Field

Exemplary implementations of the invention relate generally to a display device and more specifically, to a display device having an input sensor with an optical pattern.

Discussion of the Background

The display devices may be classified into a self-emissive display device that has a light emitting element that emits light to display an image or a non-emissive display device that controls transmittance of external light to display an image. The self-emissive display device may include an organic light emitting display device. The light generated by a light emitting layer of the organic light emitting display device may be emitted not only in a forward direction but also in a lateral direction.

The above information disclosed in this Background section is only for understanding of the background of the inventive concepts, and, therefore, it may contain information that does not constitute prior art.

SUMMARY

Applicant discovered that display devices may have a color variation according to the user's viewing angle due to variations caused by the refraction of light. For example, when a display device displays a white color image, a user may observe a different color light than white according to the viewing angle of the user.

Display devices with an input sensor constructed according to the principles and exemplary implementations of the invention provide improved display quality. For example, the input sensor may include an optical pattern that changes the optical paths of light generated by a display panel. As a result, the color variation according to the viewing angle may not be perceptible to the user, thereby enhancing the display quality of the display device.

Additional features of the inventive concepts will be set forth in the description which follows, and in part will be apparent from the description, or may be learned by practice of the inventive concepts.

According to one aspect of the invention, a display device includes a display panel having a plurality of light emitting areas; and an input sensor disposed directly on the display panel and including a first conductive layer and a first insulating layer disposed on the first conductive layer, wherein the first insulating layer includes a plurality of optical patterns that extend in a direction away from the first conductive layer.

Each of the plurality of optical patterns may overlap n light emitting areas of the plurality of light emitting areas (where, n is a positive number of 1 or greater).

Each of the plurality of light emitting areas may overlap m optical patterns of the plurality of optical patterns (where, m is a positive number of 1 or greater).

The plurality of optical patterns may include a plurality of lens patterns.

The plurality of lens patterns may include a plurality of grooves defined in the first insulating layer.

The plurality of grooves may include a plurality of first grooves and a plurality of second grooves, and wherein: the plurality of first grooves may extend in a first direction and are spaced apart from each other in a second direction intersecting the first direction, and the plurality of second grooves may extend in the second direction and are spaced apart from each other in the first direction.

When viewed in plan, the plurality of first grooves and the plurality of second grooves may intersect each other.

When viewed in plan, the plurality of first grooves and the plurality of second grooves may be spaced apart from and do not overlap each other.

Each of the plurality of grooves may include a bottom surface and a side surface extending from the bottom surface in the direction away from the first conductive layer to define the plurality of lens patterns.

Each of the plurality of grooves may include a bottom line and a side surface extending from the bottom line in the direction away from the first conductive layer to define the plurality of lens patterns.

Each of the plurality of grooves may have a depth less than a maximum thickness of the first insulating layer.

Each of the plurality of optical patterns may have a height greater than or equal to a maximum thickness of the first insulating layer.

The first conductive layer may include a sensing pattern having a plurality of openings, and when viewed in plan, each of the plurality of openings overlaps at least one optical pattern of the plurality of optical patterns.

The input sensor further may include a second conductive layer disposed on the first insulating layer and a second insulating layer disposed on the second conductive layer, wherein the second insulating layer may have a refractive index greater than a refractive index of the first insulating layer.

The input sensor may include an input sensing panel and the first insulating layer may include an organic layer.

The input sensor may further include a second conductive layer having a surface disposed on the first conductive layer, and the plurality of optical patterns cover substantially the entire surface of the second conductive layer.

The first conductive layer may be disposed on a base surface, the plurality of optical patterns may be spaced apart from each other, and a portion of the base surface may be exposed in an area between the plurality of optical patterns.

The first insulating layer may further include a lower insulating layer disposed below the plurality of optical patterns.

The plurality of optical patterns may be spaced apart from each other, and a portion of the lower insulating layer may be exposed in an area between the plurality of optical patterns.

The plurality of optical patterns may be adjacent to each other.

The display panel may comprise a base layer, a circuit element layer disposed on the base layer, a display element layer disposed on the circuit element layer, and an encapsulation layer disposed on the display element layer. The input sensor may further include a base insulating layer in direct contact with the encapsulation layer. The first conductive layer may be disposed on the base insulating layer.

According to another aspect of the invention, a display device includes a display panel; and an input sensor disposed directly on the display panel, wherein the input sensor includes: a first conductive layer disposed on the display panel and defining a plurality of openings; an organic layer disposed on the first conductive layer, the organic layer including a contact hole exposing a portion of the first conductive layer and a plurality of optical patterns having curved upper surfaces; a second conductive layer disposed on the organic layer and electrically connected to the first conductive layer through the contact hole; and a cover layer to cover the second conductive layer, the cover layer being disposed on the organic layer and having a refractive index greater than a refractive index of the organic layer.

When viewed in plan, each of the plurality of openings of the first conductive layer may overlap at least one optical pattern of the plurality of optical patterns.

A groove may be formed in the organic layer between the plurality of optical patterns, and the groove may have a depth less than or equal to a maximum thickness of the organic layer.

The first conductive layer may be disposed on a base surface, and a portion of the cover layer is in contact with the base surface.

According to another aspect of the invention, the method comprising the steps of: forming a display panel; and forming an input sensor on the display panel by: forming a first conductive layer on the display panel; forming a first insulating layer to cover the first conductive layer; and patterning the first insulating layer to form simultaneously a contact hole exposing the first conductive layer and a plurality of optical patterns that extend in a direction away from the first conductive layer.

The step of forming the input sensor further comprises the steps of: forming a second conductive layer in contact with the first conductive layer through the contact hole and in a position adjacent to the plurality of optical patterns; and forming a second insulating layer covering the second conductive layer and the plurality of optical patterns, wherein the second insulating layer has a refractive index greater than a refractive index of the first insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
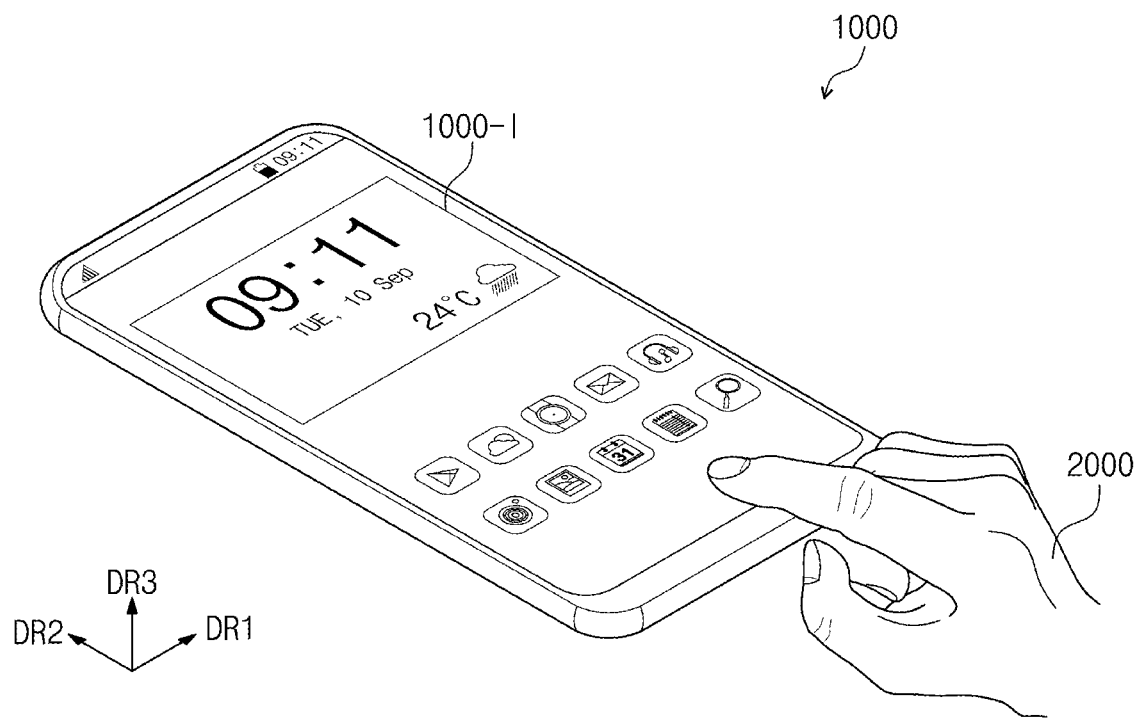
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
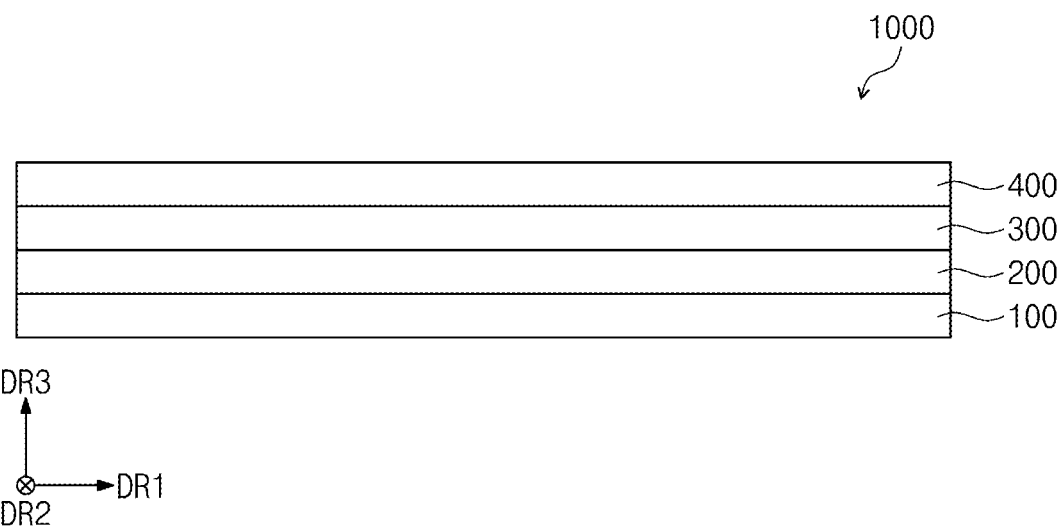
FIG. 2 is a cross-sectional view of the display device of FIG. 1.

FIG. 1 is a perspective view of an exemplary embodiment of a display device constructed according to the principles of the invention. FIG. 2 is a cross-sectional view of the display device of FIG. 1.

Referring to FIG. 1, a display device 1000 may be a device activated according to an electrical signal. The display device 1000 may be applied to large scale electronic apparatuses such as televisions and monitors. Also, the display device 1000 may be applied to small-to-medium scale electronic apparatuses such as mobile phones, tablets, vehicular navigation devices, game consoles, and smart watches. In exemplary embodiments, the display device 1000 is illustrated as a smart phone for descriptive convenience, but the exemplary embodiments are not limited thereto.

The display device 1000 may display, in a third direction DR3, an image 1000-I on a display surface substantially parallel to each of a first direction DR1 and a second direction DR2. The display surface on which the image 1000-I is displayed may correspond to a front surface of the display device 1000.

In exemplary embodiments, a front surface (or a top surface) and a rear surface (or a bottom surface) for each member are defined according to the direction in which the image 1000-I is displayed. The front and rear surfaces are opposed to each other in the third direction DR3, and the normal direction of each of the front and rear surfaces may be parallel to the third direction DR3.

Referring to FIG. 2, the display device 1000 may include a display panel 100, an input sensor such as an input sensing panel 200, an anti-reflection layer 300, and a window 400, which are stacked upon each other.

The display panel 100 is the component that generates the image 1000-I. The display panel 100 may be a light emitting display panel. For example, the display panel 100 may be an organic light emitting display panel or a quantum-dot light emitting display panel, or other types of panels known in the art.

The input sensing panel 200 may be disposed on the display panel 100. The input sensing panel 200 may be referred to as an input sensing layer, an input sensing unit, or an input sensing member.

In an exemplary embodiment, the display panel 100 and the input sensing panel 200 may be formed by continuous processes. In this case, the input sensing panel 200 may be disposed directly on the display panel 100. In other words, an intervening third component may not be disposed between the input sensing panel 200 and the display panel 100. In this case, a separate adhesive member between the input sensing panel 200 and the display panel 100 is not required.

In another exemplary embodiment, the display panel 100 and the input sensing panel 200 may be coupled to each other through an adhesive member. The adhesive member may include a general adhesive or bonding agent. For example, the adhesive member may be a pressure sensitive adhesive film (PSA) or a transparent adhesive member such as an optically clear adhesive film (OCA) or an optically clear resin (OCR).

The input sensing panel 200 senses an external input 2000 applied from the outside. For example, the external input 2000 may be an input of a user. The input of the user may include various types of external inputs such as a portion of the user's body, light, heat, a pen, or pressure. Referring to FIG. 1, the external input 2000 is illustrated as a hand of a user. However, exemplary embodiments are not limited thereto. As described above, the type of external input 2000 may vary as known in the art. Also, the input sensing panel 200 may sense the external input 2000 applied to the side surface or the bottom surface of the display device 1000, but exemplary embodiments are not limited thereto.

The anti-reflection layer 300 may be disposed on the input sensing panel 200. The anti-reflection layer 300 may reduce reflectivity of external light which is incident from the outside. The anti-reflection layer 300 may include a phase retarder and a polarizer. Also, the anti-reflection layer 300 may include color filters. The color filters may have a predetermined arrangement, and the arrangement of the color filters may be determined by taking light emission colors of pixels into consideration. The anti-reflection layer 300 may be omitted.

The window 400 may be disposed above the anti-reflection layer 300. The window 400 may include an optically transparent insulating material. For example, the window 400 may include glass or plastic. The window 400 may have a multi-layered or single-layered structure. For example, the window 400 may include a plurality of plastic films which are coupled by an adhesive, or a glass substrate and a plastic film which are coupled to each other by an adhesive.

Figure 3:
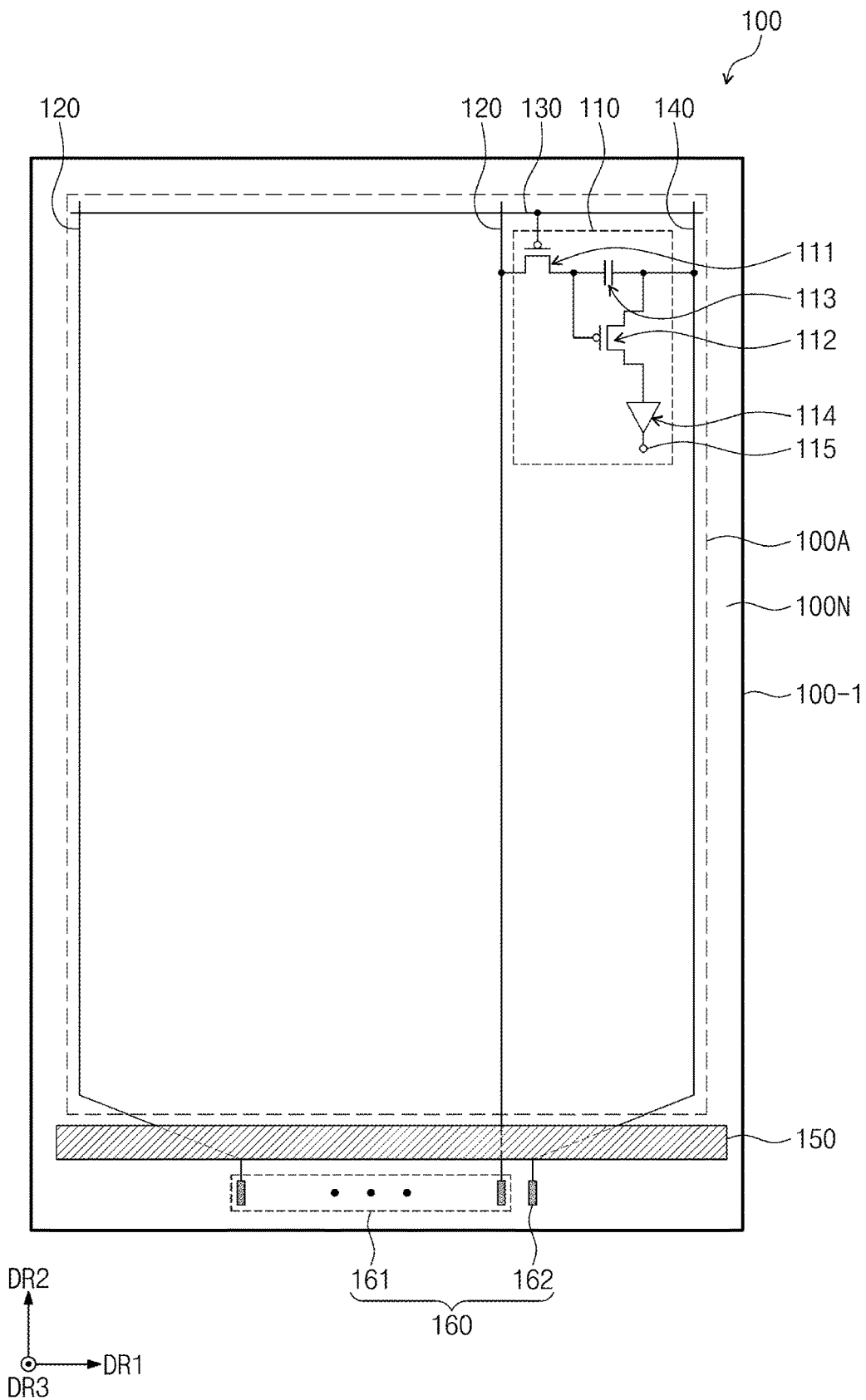
FIG. 3 is a plan view of the display panel of FIG. 2.

FIG. 3 is a plan view of the display panel of FIG. 2.

Referring to FIG. 3, the display panel 100 may include an active area 100A and a peripheral area 100N. The active area 100A may be an area activated according to an electrical signal. For example, the active area 100A may be an area that displays an image. The peripheral area 100N may surround the active area 100A. A driving circuit, a driving line, or the like for driving the active area 100A may be disposed in the peripheral area 100N.

The display panel 100 may include a base layer 100-1, a plurality of pixels 110, a plurality of signal lines 120, 130, and 140, a power pattern 150, and a plurality of display pads 160.

The base layer 100-1 may include a synthetic resin layer. The synthetic resin layer may be formed of thermosetting resin. The base layer 100-1 may have a multi-layered structure. For example, the base layer 100-1 may have a three-layered structure of a synthetic resin layer, an adhesive layer, and a synthetic resin layer. In particular, the synthetic resin layer may be a polyimide-based resin layer, but exemplary embodiments are not limited thereto. The synthetic resin layer may include at least one of an acryl-based resin, a methacryl-based resin, polyisoprene, a vinyl-based resin, an epoxy-based resin, a urethane-based resin, a cellulose-based resin, a siloxane-based resin, a polyamide-based resin, or a perylene-based resin. In addition, the base layer 100-1 may include a glass substrate or an organic/inorganic composite material substrate, or the like.

The signal lines 120, 130, and 140 are connected to the pixels 110 and may transmit or transfer electrical signals to the pixels 110. Referring to FIG. 3, the signal lines 120, 130, and 140 is illustrated as a data line 120, a scan line 130, and a power line 140, but exemplary embodiments are not limited thereto. For example, the signal lines 120, 130, and 140 may further include at least one of an initialization voltage line or a light emission control line, but exemplary embodiments are not limited thereto.

The pixels 110 may be disposed in the active area 100A. Referring to FIG. 3, an enlarged equivalent circuit diagram of one representative pixel 110 of the plurality of pixels is illustrated as an example, but exemplary embodiments are not limited thereto. Each of the pixels 110 may include a first transistor 111, a second transistor 112, a capacitor 113, and a light emitting element 114. The first transistor 111 may be an element for controlling an on-off state of the pixel 110. The first transistor 111 may transmit or block a data signal transmitted through the data line 120 in response to a scan signal transmitted through the scan line 130.

The capacitor 113 may be connected to the first transistor 111 and the power line 140. The capacitor 113 charges an amount of electric charges corresponding to the voltage difference between the data signal transmitted from the first transistor 111 and a first power signal applied to the power line 140.

The second transistor 112 is connected to the first transistor 111, the capacitor 113, and the light emitting element 114. The second transistor 112 responds to an amount of electric charge stored in the capacitor 113 and controls driving current flowing through the light emitting element 114. Based on the amount of electric charges charged in the capacitor 113, the turn-on time of the second transistor 112 may be determined. The second transistor 112 provides the driving current, which is transmitted through the power line 140 during the turn-on time of the second transistor 112, to the light emitting element 114.

The light emitting element 114 may generate light or control a quantity of light (or intensity of light) based on the driving current provided from the second transistor 112. For example, the light emitting element 114 may include an organic light emitting element or a quantum dot light emitting element.

The light emitting element 114 is connected to a power terminal 115 and receives a second power signal, which is different from the first power signal provided from the power line 140, through a second power line. The driving current, which corresponds to a difference between the second power signal and an electrical signal provided from the second transistor 112, flows through the light emitting element 114, and the light emitting element 114 may generate light corresponding to the driving current. Referring to FIG. 3, the pixel 110 is described as an example, but exemplary embodiments are not limited thereto. For example, the pixel 110 may include electronic elements having various configurations and arrangements.

The power pattern 150 may be disposed in the peripheral area 100N. The power pattern 150 may be electrically connected to a plurality of power lines 140. The display panel 100 includes the power pattern 150, and may provide first power signals, which have the substantially same level, to the plurality of pixels 110.

The display pads 160 may include a first pad 161 and a second pad 162. The first pad 161 is provided in plurality and may be connected to respective data lines 120. The second pad 162 is connected to the power pattern 150 and may be electrically connected to the power line 140. The display panel 100 may provide the electrical signals, which are provided from the outside through the display pads 160, to the pixels 110. For example, the display pads 160 may further include pads for receiving other electrical signals in addition to the first pad 161 and the second pad 162, but exemplary embodiments are not limited thereto.

Figure 4:
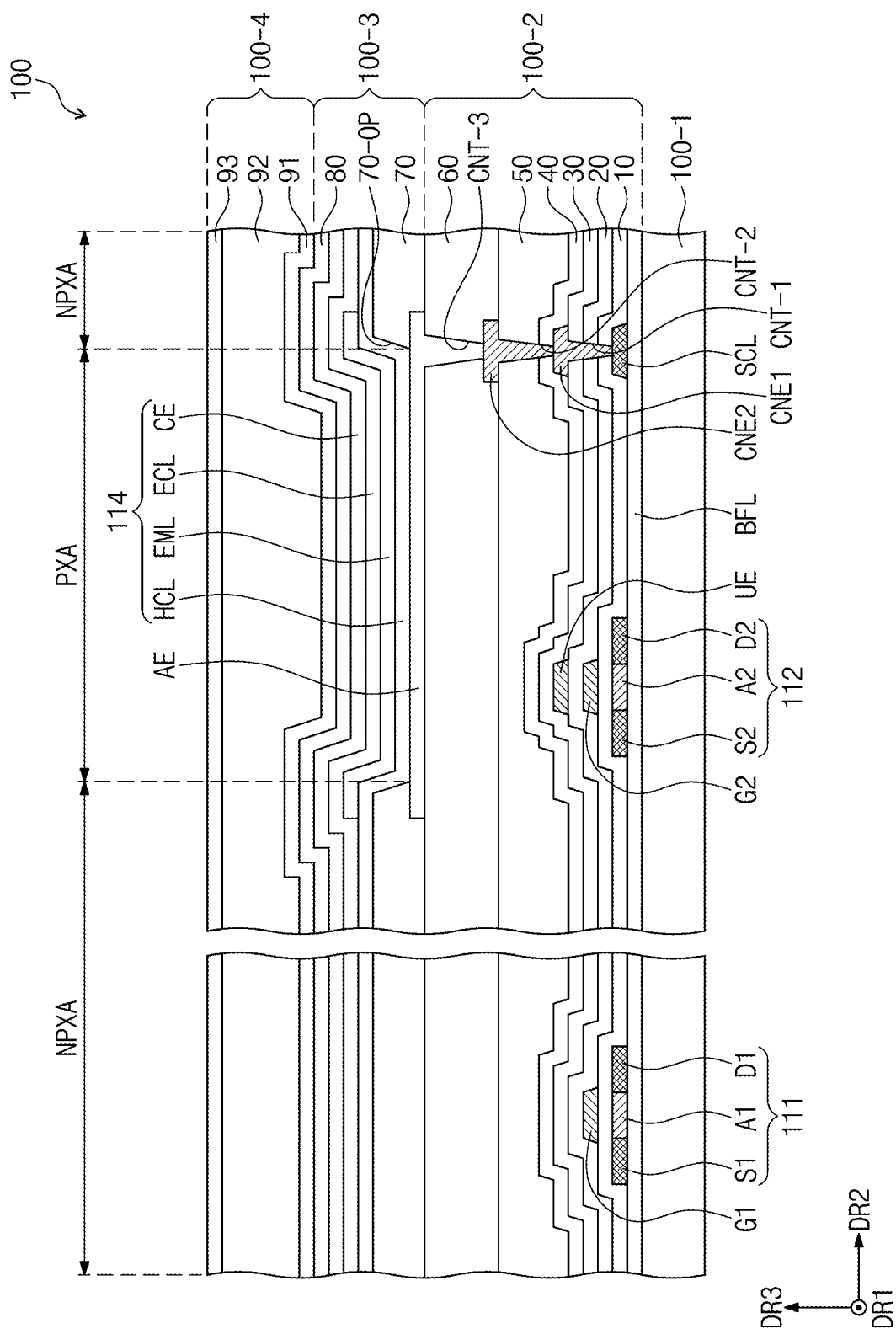
FIG. 4 is a cross-sectional view of the display panel of FIG. 2.

FIG. 4 is a cross-sectional view of the display panel of FIG. 2.

Referring to FIG. 4, a display panel 100 may include a plurality of insulating layers, semiconductor patterns, conductive patterns, signal lines, or the like. By a method of coating, deposition, or the like, an insulating layer, a semiconductor layer, and a conductive layer may be formed. Subsequently, by a photolithography method, the insulating layer, the semiconductor layer, and the conductive layer may be selectively patterned. The semiconductor pattern, the conductive pattern, the signal line, or the like, which is provided in a circuit element layer 100-2 and a display element layer 100-3, may be formed by the methods described above. Subsequently, an encapsulation layer 100-4 may be formed to cover the display element layer 100-3.

At least one inorganic layer is formed on the top surface of a base layer 100-1. The inorganic layer may include at least one of an aluminum oxide, a titanium oxide, a silicon oxide, a silicon oxynitride, a zirconium oxide, or a hafnium oxide. The inorganic layer may be formed in a multi layered structure. The multi-layered inorganic layers may constitute a barrier layer and/or a buffer layer. Referring to FIG. 4, the display panel 100 is illustrated as including a buffer layer BFL, but exemplary embodiments are not limited thereto.

The buffer layer BFL may improve a coupling force between the base layer 100-1 and the semiconductor pattern. The buffer layer BFL may include a silicon oxide layer and a silicon nitride layer. The silicon oxide layer and the silicon nitride layer may be alternately stacked to form the buffer layer BFL.

The semiconductor pattern is disposed on the buffer layer BFL. The semiconductor pattern may include polysilicon. However, exemplary embodiments are not limited thereto. For example, the semiconductor pattern may include amorphous silicon or a metal oxide.

Referring to FIG. 4, only a portion of the semiconductor pattern is illustrated, but another portion of the semiconductor pattern may be disposed in other areas. The semiconductor pattern corresponding to pixels 110 of FIG. 3 may be arranged according to a specific rule. The semiconductor pattern may have different electrical characteristics depending on whether the semiconductor pattern is doped or non-doped. The semiconductor pattern may include a doped area and a non-doped area. The doped area may be doped with an N-type dopant or a P-type dopant. A P-type transistor may include a doped area which is doped with the P-type dopant.

The doped area has a conductivity greater than that of the non-doped area and is suitable to be used as an electrode or a signal line. The non-doped area may be suitable to be used as an active area (or channel) of a transistor. For example, a portion of the semiconductor pattern may be the active area of the transistor, another portion thereof may be a source or a drain of the transistor, and the other portion thereof may be a connection electrode or a connection signal line.

As illustrated in FIG. 4, a source S1, an active area A1, and a drain D1 of a first transistor 111 are formed in the semiconductor pattern, and a source S2, an active area A2, and a drain D2 of a second transistor 112 are formed in the semiconductor pattern. The sources S1 and S2 and the drains D1 and D2 may extend from the active areas A1 and A2 in opposite directions, respectively, on a cross-section. A portion of a connection signal line SCL formed in the semiconductor pattern is illustrated in FIG. 4. For example, the connection signal line SCL may be connected to the drain D2 of the second transistor 112 on a plane.

A first insulating layer 10 may be disposed on the buffer layer BFL. The first insulating layer 10 partially or entirely overlaps the plurality of pixels 110 of FIG. 3 and covers the semiconductor pattern. The first insulating layer 10 may include an inorganic layer and/or an organic layer and may have a single or multi-layered structure. The first insulating layer 10 may include at least one of an aluminum oxide, a titanium oxide, a silicon oxide, a silicon oxynitride, a zirconium oxide, or a hafnium oxide. In an exemplary embodiment, the first insulating layer 10 may be a single-layered silicon oxide layer. An insulating layer of the circuit element layer 100-2, which will be described later, as well as the first insulating layer 10 may include an inorganic layer and/or an organic layer, and may have a single or multi-layered structure. The organic layer may be formed of at least one of the materials described above.

Gates G1 and G2 are disposed on the first insulating layer 10. The gate G1 may be a portion of metal pattern. The gate G1 and G2 may overlap the active areas A1 and A2. In a process of doping the semiconductor pattern, the gates G1 and G2 may be formed with the same mask.

A second insulating layer 20 may be disposed on the first insulating layer 10 to cover the gates G1 and G2. The second insulating layer 20 partially or entirely overlaps the plurality of pixels 110 of FIG. 3. The second insulating layer 20 may be an inorganic layer and/or an organic layer and may have a single or multi-layered structure. In an exemplary embodiment, the second insulating layer 20 may be a single-layered silicon oxide layer.

An upper electrode UE may be disposed on the second insulating layer 20. The upper electrode UE may overlap the gate G2 of the second transistor 112. The upper electrode UE may be a portion of a metal pattern. A portion of the gate G2 and the upper electrode UE overlapping the gate G2 may define the capacitor 113 (see FIG. 3). In an exemplary embodiment, the upper electrode UE may be omitted.

A third insulating layer 30 for covering the upper electrode UE may be disposed on the second insulating layer 20. In an exemplary embodiment, the third insulating layer 30 may be a single-layered silicon oxide layer. A first connection electrode CNE1 may be disposed on the third insulating layer 30. The first connection electrode CNE1 may be connected to the connection signal line SCL through a contact hole CNT-1 that passes through the first to third insulating layers 10, 20, and 30.

A fourth insulating layer 40 is disposed on the third insulating layer 30. The fourth insulating layer 40 may be a single-layered silicon oxide layer. A fifth insulating layer 50 is disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 that passes through the fourth insulating layer 40 and the fifth insulating layer 50.

A sixth insulating layer 60 may be disposed on the fifth insulating layer 50 to cover the second connection electrode CNE2. The sixth insulating layer 60 may be an organic layer. A first electrode AE is disposed on the sixth insulating layer 60. The first electrode AE is connected to the second connection electrode CNE2 through a contact hole CNT-3 that passes through the sixth insulating layer 60. An opening portion 70-OP may be defined in a pixel defining layer 70. The opening portion 70-OP of the pixel defining layer 70 exposes at least a portion of the first electrode AE.

As illustrated in FIG. 4, the active area 100A of FIG. 3 may include a light emitting area PXA and a non-light emitting area NPXA adjacent to the light emitting area PXA. The non-light emitting area NPXA may surround the light emitting area PXA. In an exemplary embodiment, the light emitting area PXA is defined corresponding to a partial area of the first electrode AE exposed by the opening portion 70-OP.

A hole control layer HCL may be disposed in all of the light emitting area PXA and the non-light emitting area NPXA. The hole control layer HCL may include a hole transport layer and may further include a hole injection layer. A light emitting layer EML is disposed on the hole control layer HCL. The light emitting layer EML may be disposed in an area corresponding to the opening portion 70-OP. For example, the light emitting layer EML may be separately provided for each of the pixels 110.

An electron control layer ECL is disposed on the light emitting layer EML. The electron control layer ECL may include an electron transport layer and may further include an electron injection layer. The hole control layer HCL and the electron control layer ECL may be formed in the plurality of pixels 110 with an open mask. A second electrode CE is disposed on the electron control layer ECL. The second electrode CE has a single integrated shape and is disposed in the plurality of pixels 110 of FIG. 3.

A capping layer 80 is disposed on the second electrode CE and is in contact with the second electrode CE. The capping layer 80 may include an organic material. The capping layer 80 protects the second electrode CE from damage or contamination during a subsequent process, for example, a sputtering process such that light emitting efficiency of the light emitting element 114 is improved. The capping layer 80 may have a refractive index greater than that of a first inorganic layer 91 which will be described later.

The encapsulation layer 100-4 may be disposed on the display element layer 100-3. The encapsulation layer 100-4 may include a first inorganic layer 91, an organic layer 92, and a second inorganic layer 93. The first inorganic layer 91 and the second inorganic layer 93 protect the display element layer 100-3 against moisture or oxygen. The organic layer 92 protects the display element layer 100-3 against impurities such as dust particles. Each of the first inorganic layer 91 and the second inorganic layer 93 may include one of a silicon nitride layer, a silicon oxynitride layer, and a silicon oxide layer. In an exemplary embodiment, each of the first inorganic layer 91 and the second inorganic layer 93 may include a titanium oxide layer, an aluminum oxide layer, or the like. The organic layer 92 may include an acryl-based organic layer, but exemplary embodiments are not limited thereto.

In an exemplary embodiment, an inorganic layer, for example, a LiF layer may be additionally disposed between the capping layer 80 and the first inorganic layer 91. The LiF layer may improve light emitting efficiency of the light emitting element 114.

Figure 5:
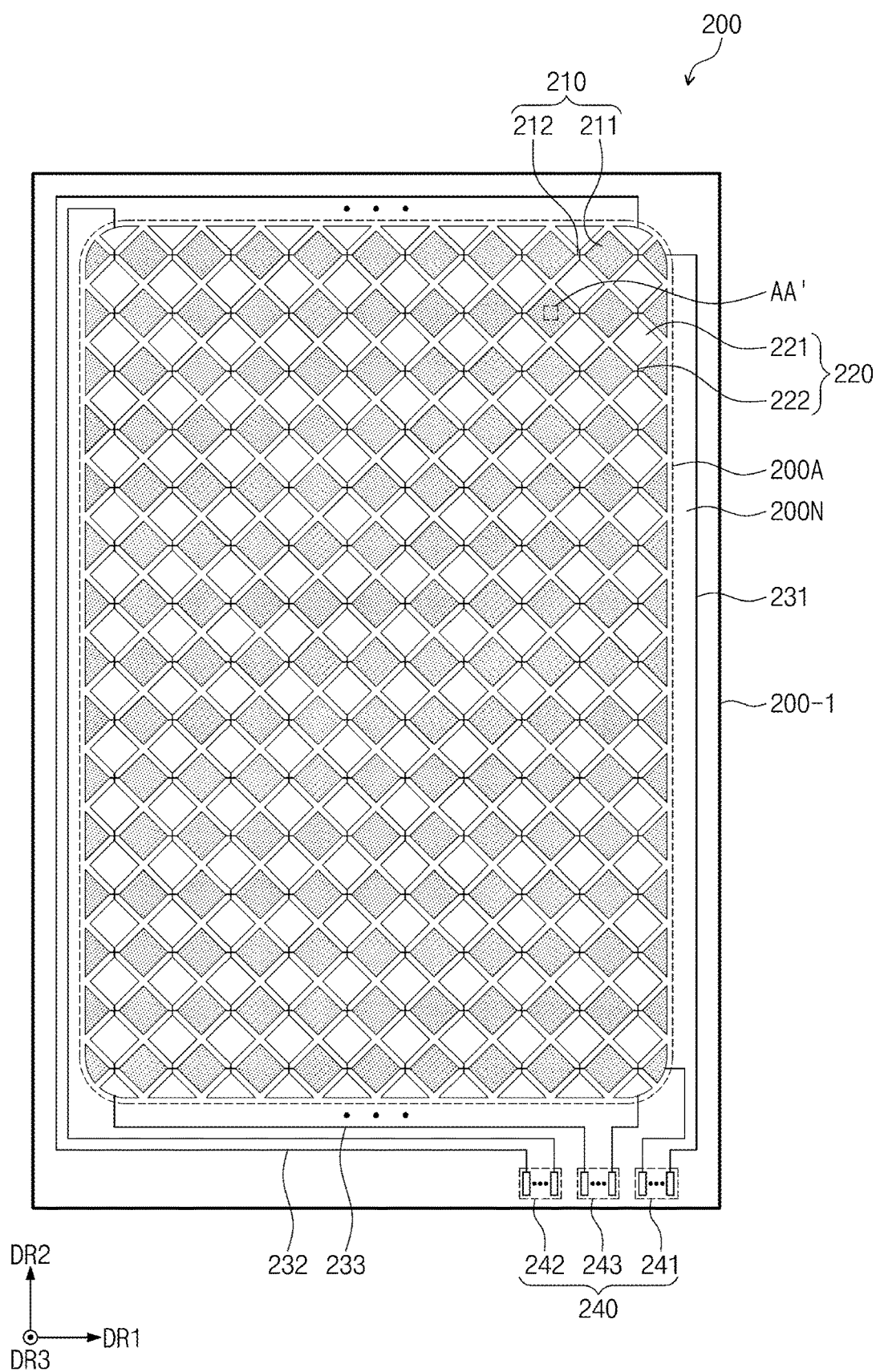
FIG. 5 is a plan view of the input sensing panel of FIG. 2.

FIG. 5 is a plan view of the input sensing panel of FIG. 2.

Referring to FIG. 5, the input sensing panel 200 may include an active area 200A and a peripheral area 200N. The active area 200A may be an area which is activated according to an electrical signal. For example, the active area 200A may be an area which senses an input. The peripheral area 200N may surround the active area 200A.

The input sensing panel 200 may include a base insulating layer 200-1, first sensing electrodes 210, second sensing electrodes 220, sensing lines 231, 232, and 233, and sensing pads 240. The first sensing electrodes 210 and the second sensing electrodes 220 may be disposed in the active area 200A, and the sensing lines 231, 232, and 233 and the sensing pads 240 may be disposed in the peripheral area 200N.

The base insulating layer 200-1 may include one of a silicon nitride layer, a silicon oxynitride layer, and a silicon oxide layer. The base insulating layer 200-1 may be disposed (indirectly or directly) on the second inorganic layer 93 of FIG. 4. The base insulating layer 200-1 may also include an organic layer.

The base insulating layer 200-1 may be disposed (directly or indirectly) on the display panel 100 of FIG. 4. For example, the base insulating layer 200-1 may be in direct contact with the second inorganic layer 93 of FIG. 4. Alternatively, the base insulating layer 200-1 may be omitted. Alternatively, the base insulating layer 200-1 may be provided on a separate base layer, and the base layer may be coupled to the display panel 100 of FIG. 4 through an adhesive member. The base insulating layer 200-1 may have a single or multi-layered structure.

The input sensing panel 200 may acquire or sense information about the external input 2000 of FIG. 1 based on a change in capacitance between the first sensing electrodes 210 and the second sensing electrodes 220.

Each of the first sensing electrodes 210 may extend in a first direction DR1, and the first sensing electrodes 210 may be arranged in a second direction DR2. The first sensing electrodes 210 may include first sensing patterns 211 and first connection patterns 212. The first connection patterns 212 may electrically connect two neighboring first sensing patterns 211. The first sensing patterns 211 and the first connection patterns 212 of each first sensing electrode 210 are disposed on the same layer and may be connected to each other. Accordingly, the first sensing patterns 211 may be referred to as first portions, and the first connection patterns 212 may be referred to as second portions.

Each of the second sensing electrodes 220 may extend in the second direction DR2, and the second sensing electrodes 220 may be arranged in the first direction DR1. The second sensing electrodes 220 may include second sensing patterns 221 and second connection patterns 222. The second connection patterns 222 may electrically connect two neighboring second sensing patterns 221. The second sensing patterns 221 and the second connection patterns 222 may be disposed on different layers. The second connection patterns 222 may be referred to as bridge patterns.

The sensing lines 231, 232, and 233 may include first sensing lines 231, second sensing lines 232, and third sensing lines 233. The first sensing lines 231 may be electrically connected to the first sensing electrodes 210, respectively. Each of the second sensing lines 232 may be electrically connected to one end of the respective second sensing electrode 220, and each of the third sensing lines 233 may be electrically connected to the other end of the respective second sensing electrode 220.

The second sensing electrodes 220 may be arranged to have relatively longer lengths when compared to the first sensing electrodes 210. Thus, two sensing lines 232 and 233 may be electrically connected to each of the second sensing electrodes 220. Thus, sensitivity of the second sensing electrodes 220 may be maintained substantially uniformly. However, exemplary embodiments are not limited thereto. For example, the second sensing lines 232 or the third sensing lines 233 may be omitted.

The sensing pads 240 may include first sensing pads 241, second sensing pads 242, and third sensing pads 243. The first sensing pads 241 may be connected to the first sensing lines 231, respectively. The second sensing pads 242 may be connected to the second sensing lines 232, respectively. The third sensing pads 243 may be connected to the third sensing lines 233, respectively.

Figure 6:
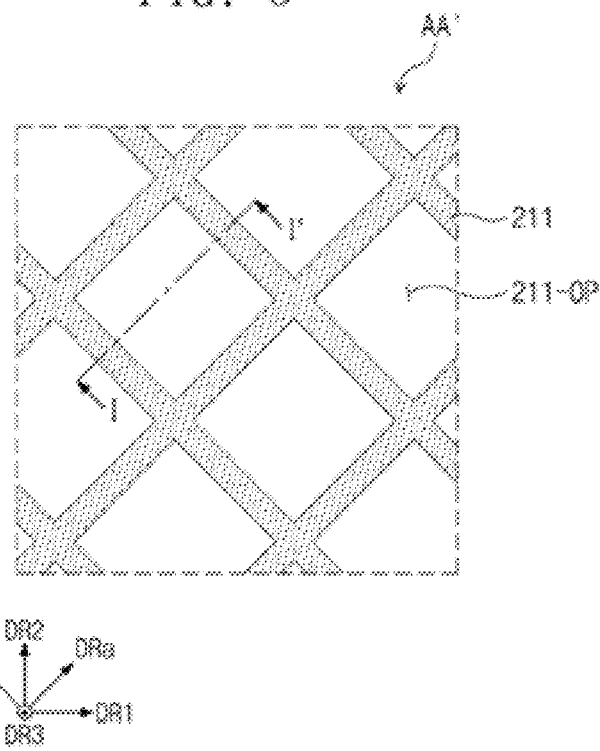
FIG. 6 is an enlarged plan view of an exemplary embodiment of the input sensing panel illustrating a portion AA' of FIG. 5.
Figure 7:
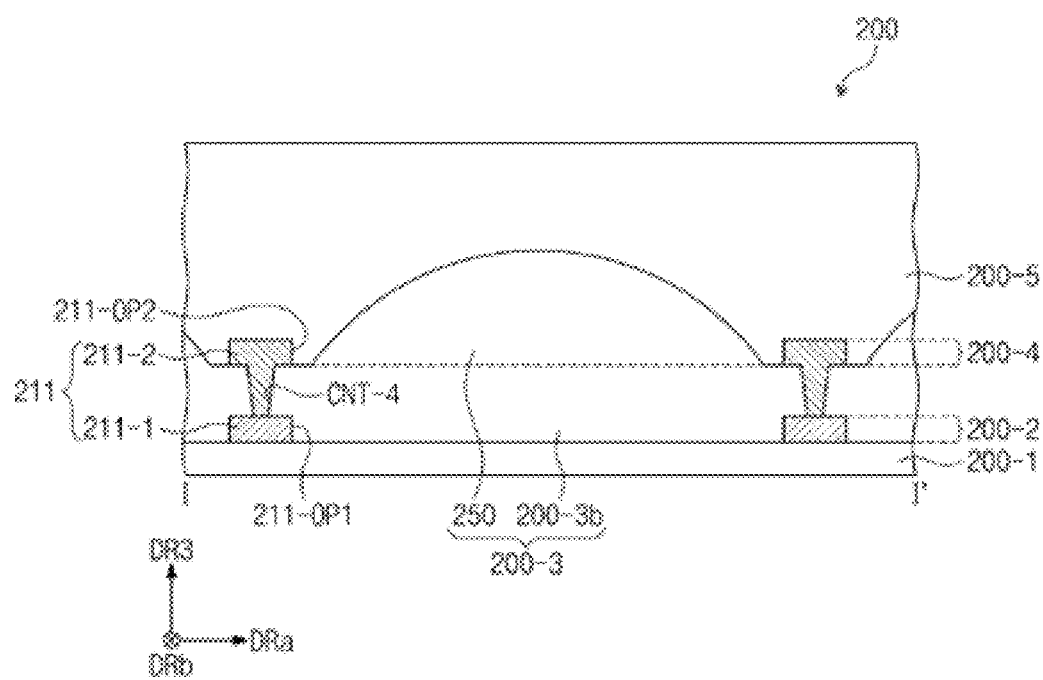
FIG. 7 is a cross-sectional view of the input sensing panel taken along line I-I' of FIG. 6.

FIG. 6 is an enlarged plan view of an exemplary embodiment of the input sensing panel illustrating a portion AA' of FIG. 5. FIG. 7 is a cross-sectional view of the input sensing panel taken along line I-I' of FIG. 6.

Referring to FIGS. 5, 6, and 7, an enlarged view of the first sensing pattern 211 is illustrated. The first sensing pattern 211 may have a mesh shape. For example, the first sensing pattern 211 may be constituted by lines extending in a first direction DRa and lines extending in a second direction DRb. A plurality of openings 211-OP may be defined in the first sensing pattern 211 by the lines described above.

The first direction DRa may be defined as a direction between a first direction DR1 and a second direction DR2, and the second direction DRb may be defined as a direction intersecting the first direction DRa.

The input sensing panel 200 may include a base insulating layer 200-1, a first conductive layer 200-2, a first insulating layer 200-3, a second conductive layer 200-4, and a second insulating layer 200-5.

The first conductive layer 200-2 may be disposed on the base insulating layer 200-1. The first insulating layer 200-3 is disposed on the first conductive layer 200-2 and may cover the first conductive layer 200-2. The second conductive layer 200-4 may be disposed on the first insulating layer 200-3. The second insulating layer 200-5 is disposed on the second conductive layer 200-4 and may cover the second conductive layer 200-4.

Each of the first conductive layer 200-2 and the second conductive layer 200-4 may include conductive patterns which are used to form the first sensing electrodes 210 and the second sensing electrodes 220. For example, each of the first sensing patterns 211 may include a first sensing pattern layer 211-1 and a second sensing pattern layer 211-2. For example, each of the first conductive layer 200-2 and the second conductive layer 200-4 may include conductive patterns which are used to form the first sensing pattern layer 211-1 and a second sensing pattern layer 211-2. First openings 211-OP1 may be defined by the first sensing pattern layer 211-1, and second openings 211-OP2 may be defined by the second sensing pattern layer 211-2.

Each of the first conductive layer 200-2 and the second conductive layer 200-4 may include metal and/or a metal alloy and may have a single or multi-layered structure. In an exemplary embodiment, each of the first conductive layer 200-2 and the second conductive layer 200-4 may have a multi-layered structure in which titanium (Ti), aluminum (Al), and titanium (Ti) are stacked in this order.

The first insulating layer 200-3 may include an inorganic layer and may have a single or multi-layered structure. In an exemplary embodiment, the first insulating layer 200-3 may be a single-layered organic layer. The first insulating layer 200-3 may be formed of at least one of an acryl-based resin, an epoxy-based resin, a phenol-based resin, a polyamide-based resin, a polyimide-based resin, a methacryl-based resin, polyisoprene, a vinyl-based resin, a urethane-based resin, a cellulose-based resin, a siloxane-based resin, or a perylene-based resin.

Referring to FIG. 7, the first insulating layer 200-3 may include a lower insulating layer 200-3b and a plurality of optical patterns in the form of a plurality of lens patterns 250 (hereinafter, a lens pattern). For example, the lens pattern 250 may be integrated with the input sensing panel 200. The lens pattern 250 may extend upwardly from the lower insulating layer 200-3b in a direction away from the first conductive layer 200-2. The lens pattern 250 may have a convex lens shape in a cross-sectional view. For example, the lens pattern 250 may have a curved upper surface. When viewed in plan, the lens pattern 250 may overlap the first openings 211-OP1 and second openings 211-OP2. For example, the lens pattern 250 may be adjacent to the second sensing pattern layer 211-2 or the second conductive layer 200-4, which are spaced apart from each other in the third direction DRa.

The refractive index of the second insulating layer 200-5 may be greater than the refractive index of the first insulating layer 200-3. For example, the second insulating layer 200-5 may include an organic material having the refractive index greater than that of the first insulating layer 200-3. For example, the second insulating layer 200-5 may include an organic material and high refractive particles mixed with the organic material. The high refractive particles may include at least one of a zirconium oxide ($ZrO_x$), a titanium dioxide ($TiO_2$), calcium carbonate ($CaCO_3$), a silicon dioxide ($SiO_2$), a zinc oxide (ZnO), aluminum hydroxide ($Al(OH)_2$), magnesium hydroxide ($Mg(OH)_2$), or lithopone ($BaSO_2$+ ZnS), but exemplary embodiments are not limited thereto.

The light provided from the display panel 100 of FIG. 2 is refracted by the lens pattern 250 and the second insulating layer 200-5, and thus the optical path may change. As a result, color variation according to the viewing angle of a user may be reduced such that a difference in color is not perceptible to the user regardless of the viewing angle. Thus, the display quality of the display device 1000 of FIG. 1 may be improved.

The color variation according to the viewing angle may be referred to as white angular dependency (WAD) phenomenon. The WAD phenomenon refers to changes in characteristics of a white image according to an angle at which the white image of the display device 1000 of FIG. 1 is viewed. For example, when the white image of the display device 1000 is displayed through the front side of the display device 1000, white color light is viewed by a user. In contrast, when the white image of the display device 1000 is displayed through the side of the display device 1000, different color light than the white color light is viewed by the user. In other words, this may be a phenomenon in which the white light is viewed on the front side of the display device 1000 of FIG. 1, but the light with a wavelength of color different from the white light is viewed on the side of the display device 1000 due to the difference in optical path.

According to an exemplary embodiment, a portion of the first insulating layer 200-3 of the input sensing panel 200 may be the lens pattern 250. Thus, since a separate layer for providing the lens pattern 250 is not added, the flexibility of the input sensing panel 200 may not deteriorate. Also, during the process of forming the contact hole CNT-4, the lens pattern 250 may be simultaneously formed. Thus, an additional mask is unnecessary, and the process may be simplified.

Figure 8:
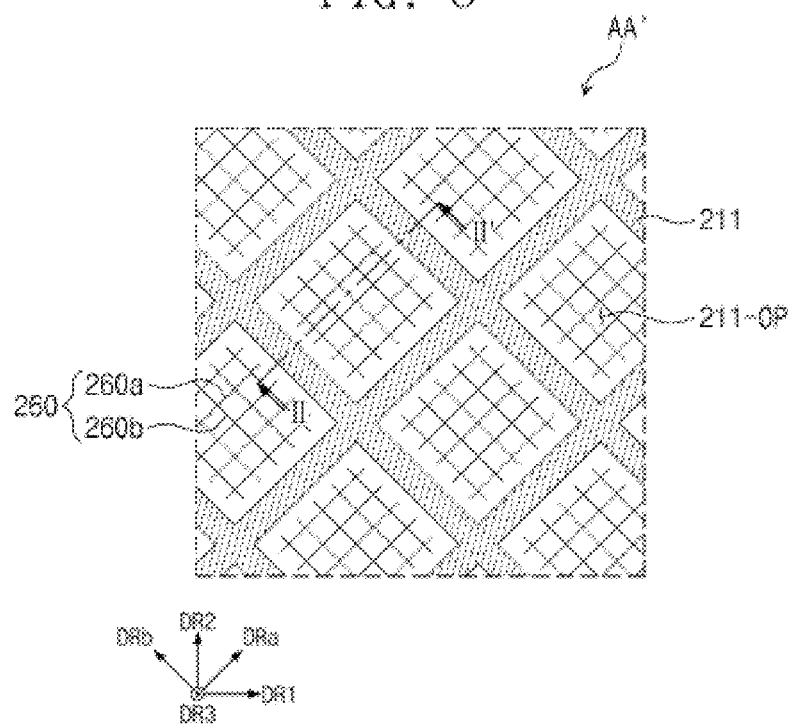
FIG. 8 is an enlarged plan view of another exemplary embodiment of the input sensing panel illustrating a portion AA' of FIG. 5.
Figure 9:
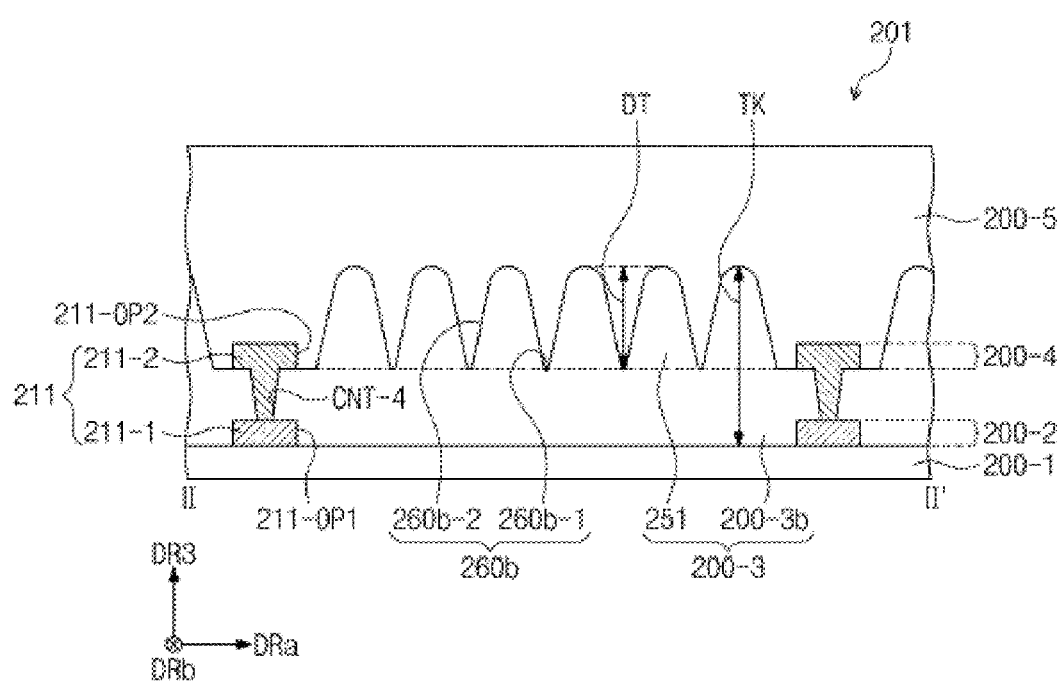
FIG. 9 is a cross-sectional view of the input sensing panel taken along line II-IF of FIG. 8.

FIG. 8 is an enlarged plan view of another exemplary embodiment of the input sensing panel illustrating a portion AA' of FIG. 5. FIG. 9 is a cross-sectional view of the input sensing panel taken along line II-IF of FIG. 8.

Referring to FIGS. 8 and 9, a plurality of grooves 260 may be defined in a first insulating layer 200-3 of an input sensing panel 201. The plurality of grooves 260 may include first grooves 260a and second grooves 260b. The first grooves 260a may extend in a first direction DRa and may be spaced apart from each other in a second direction DRb. The second grooves 260b may extend in the second direction DRb and may be spaced apart from each other in the first direction DRa.

The first grooves 260a and the second grooves 260b may intersect each other. Thus, the first grooves 260a and the second grooves 260b may define a grid pattern when viewed in plan.

A plurality of lens patterns 251 may be defined by the first grooves 260a and the second grooves 260b. For example, each of the first grooves 260a and the second grooves 260b may include a bottom line 260b-1 (of substantially one-dimension) and a side surface 260b-2 which extends upwardly from the bottom line 260b-1 in a direction away from a first conductive layer 200-2 to define the plurality of lens patterns 251.

Each of the first grooves 260a and the second grooves 260b may have a depth DT less than a maximum thickness TK of the first insulating layer 200-3. Thus, a lower insulating layer 200-3b may be formed below the plurality of lens patterns 251. For example, the lower insulating layer 200-3b may be defined as a portion of the first insulating layer 200-3 in which the first grooves 260a and the second grooves 260b are not provided. For example, the lower insulating layer 200-3b may be defined as a portion of the first insulating layer 200-3 below the first grooves 260a and the second grooves 260b in a thickness direction of the first insulating layer 200-3, i.e., in a third direction DR3. For example, the bottom line 260b-1 may be disposed at the substantially same level as a bottom surface of the second sensing pattern layer 211-2 or the second conductive layer 200-4. In an exemplary embodiment, the bottom line 260b-1 may be disposed at a lower level than an upper surface of the second sensing pattern layer 211-2 or the second conductive layer 200-4. Alternatively, the bottom line 260b-1 may be disposed at a higher level than the upper surface of the second sensing pattern layer 211-2 or the second conductive layer 200-4.

Figure 10:
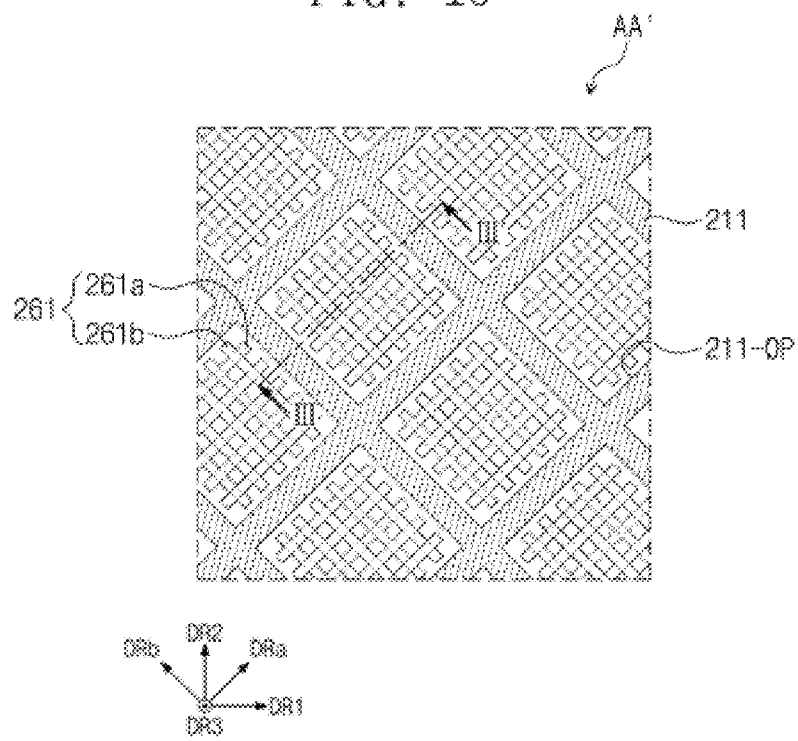
FIG. 10 is an enlarged plan view of another exemplary embodiment of the input sensing panel illustrating the portion AA' of FIG. 5.
Figure 11:
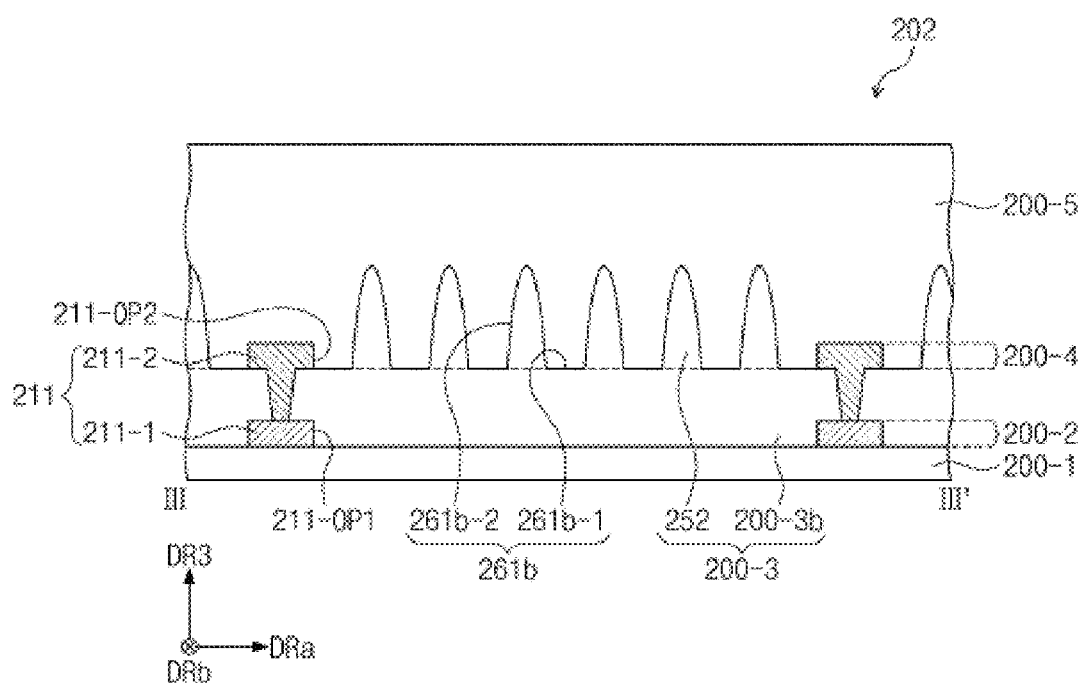
FIG. 11 is a cross-sectional view of the input sensing panel taken along line III-III' of FIG. 10.

FIG. 10 is an enlarged plan view of another exemplary embodiment of the input sensing panel illustrating the portion AA' of FIG. 5. FIG. 11 is a cross-sectional view of the input sensing panel taken along line of FIG. 10 according to an exemplary embodiment.

Referring to FIGS. 10 and 11, a plurality of grooves 261 may be formed in a first insulating layer 200-3 of an input sensing panel 202. The plurality of grooves 261 may include first grooves 261a and second grooves 261b. Each of the first grooves 261a and the second grooves 261b may be defined as a portion which is downwardly recessed from an upper surface of the first insulating layer 200-3.

A plurality of lens patterns 252 may be defined by the first grooves 261a and the second grooves 261b. For example, each of the first grooves 261a and the second grooves 261b may include a bottom surface 261b-1 and a side surface 261b-2. The bottom surface 261b-1 may be defined in two dimensions and may be defined as a plane which is substantially parallel to a first direction DRa or a second direction DRb. The side surface 261b-2 may extend from the bottom surface 261b-1 in a direction away from a first conductive layer 200-2 to define the plurality of lens patterns 252.

The plurality of lens patterns 252 may be spaced apart from each other. The bottom surface 261b-1 may be formed between the plurality of lens patterns 252. Thus, an upper surface of a lower insulating layer 200-3b may be exposed. For example, a boundary surface of a non-curved plane may be defined due to the space between the plurality of lens patterns 252, and the exposed boundary surface may be in contact with a second insulating layer 200-5. For example, the bottom surface 261b-1 may be disposed at the substantially same level as the bottom surface of the second sensing pattern layer 211-2 or the second conductive layer 200-4. In an exemplary embodiment, the bottom surface 261b-1 may be disposed at a lower level than the upper surface of the second sensing pattern layer 211-2 or the second conductive layer 200-4. Alternatively, the bottom surface 261b-1 may be disposed at a higher level than the upper surface of the second sensing pattern layer 211-2 or the second conductive layer 200-4.

In another exemplary embodiment, each of first grooves 261a and the second grooves 261b may be defined as a portion which extends upwardly from a lower insulating layer 200-3b. In this case, the first grooves 261a and the second grooves 261b may be referred to as first protruding parts and second protruding parts, respectively. The first protruding parts may extend in the first direction DRa and be arranged in the second direction DRb. The second protruding parts may extend in the second direction DRb and be arranged in the first direction DRa. The first protruding parts and the second protruding parts may be connected to each other. In this case, a grid pattern may be defined by the first protruding parts and the second protruding parts extending from the lower insulating layer 200-3b.

Figure 12:
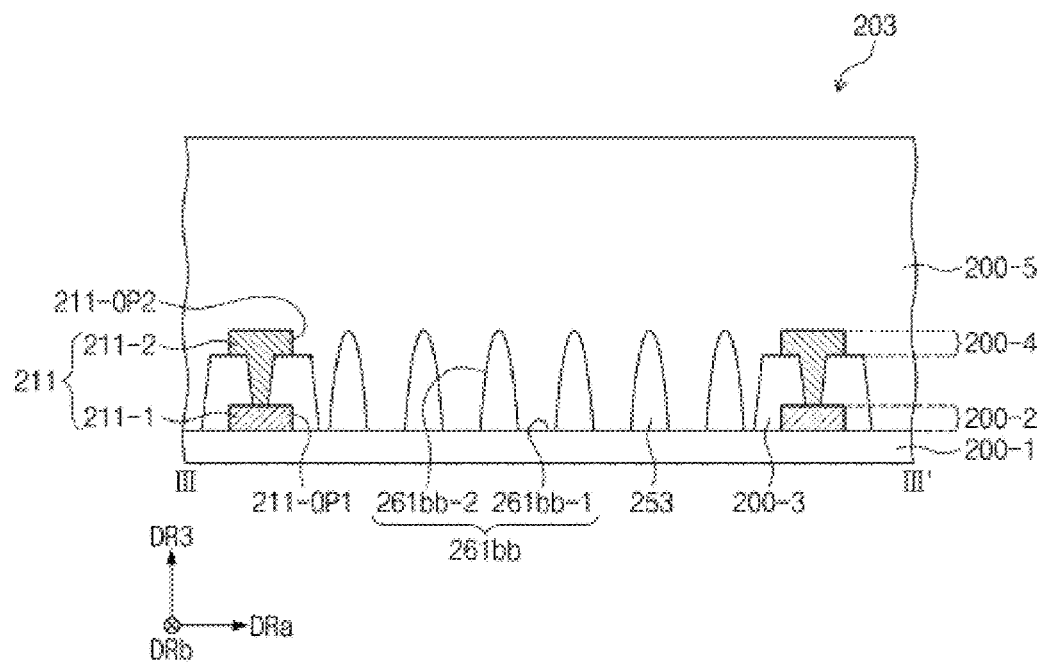
FIG. 12 is a cross-sectional view of another exemplary embodiment of the input sensing panel taken along line of FIG. 10.

FIG. 12 is a cross-sectional view of another exemplary embodiment of the input sensing panel taken along line of FIG. 10.

Referring to FIG. 12, each of grooves 261bb formed in an input sensing panel 203 may include a bottom surface 261bb-1 (of two-dimensions) and a side surface 261bb-2 which extends upwardly from bottom surface 261bb-1 in a direction away from a first conductive layer 200-2 to define a plurality of lens patterns 253. For example, the bottom surface 261bb-1 may be disposed at the substantially same level as the bottom surface of the first sensing pattern layer 211-1 or the first conductive layer 200-2.

The bottom surface 261bb-1 may correspond to an exposed upper surface of a base insulating layer 200-1. A portion of a second insulating layer 200-5 may be in direct contact with the base insulating layer 200-1. In this case, some portion of light provided from the display panel 100 of FIG. 2 may be incident directly onto the second insulating layer 200-5 through the bottom surface 261bb-1. Another portion of the light provided from the display panel 100 may be incident indirectly the second insulating layer 200-5 through the plurality of lens patterns 253. Thus, the number of layers through which the some portion of the light is transmitted may be less than the number of layers through which the other portion of the light passing through the plurality of lens patterns 253 is transmitted. As the number of layers through which the light is transmitted is reduced, an optical attenuation rate may be reduced. Thus, light emitting efficiency of light emitted to the outside of the display device 1000 of FIG. 1 may be increased by the portion (e.g., the bottom surface 261bb-1) in which the second insulating layer 200-5 and the base insulating layer 200-1 are in direct contact with each other.

Figure 13:
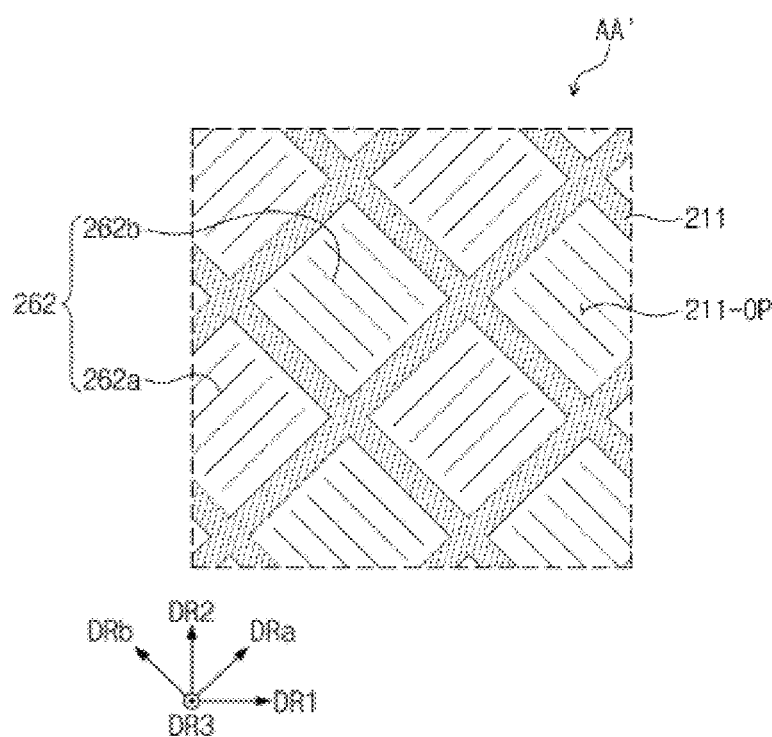
FIG. 13 is an enlarged plan view of another exemplary embodiment of the input sensing panel illustrating a portion AA' of FIG. 5.

FIG. 13 is an enlarged plan view of another exemplary embodiment of the input sensing panel illustrating a portion AA' of FIG. 5.

Referring to FIG. 13, grooves 262 may be defined in an input sensing panel 201 of FIG. 9 described above. The grooves 262 may be defined in the first insulating layer 200-3 of FIG. 9 described above. The plurality of grooves 262 may include first grooves 262a and second grooves 262b. The first grooves 262a may extend in a first direction DRa and may be spaced apart from each other in a second direction DRb. The second grooves 262b may extend in the second direction DRb and may be spaced apart from each other in the first direction DRa.

When viewed in plan, the first grooves 262a and the second grooves 262b may be spaced apart from each other. For example, the first grooves 262a and the second grooves 262b may not intersect each other. Thus, a first lens pattern defined by the neighboring two first grooves 262a may extend in the first direction DRa, and a second lens pattern defined by the neighboring two second grooves 262b may extend in the second direction DRb.

Figure 14:
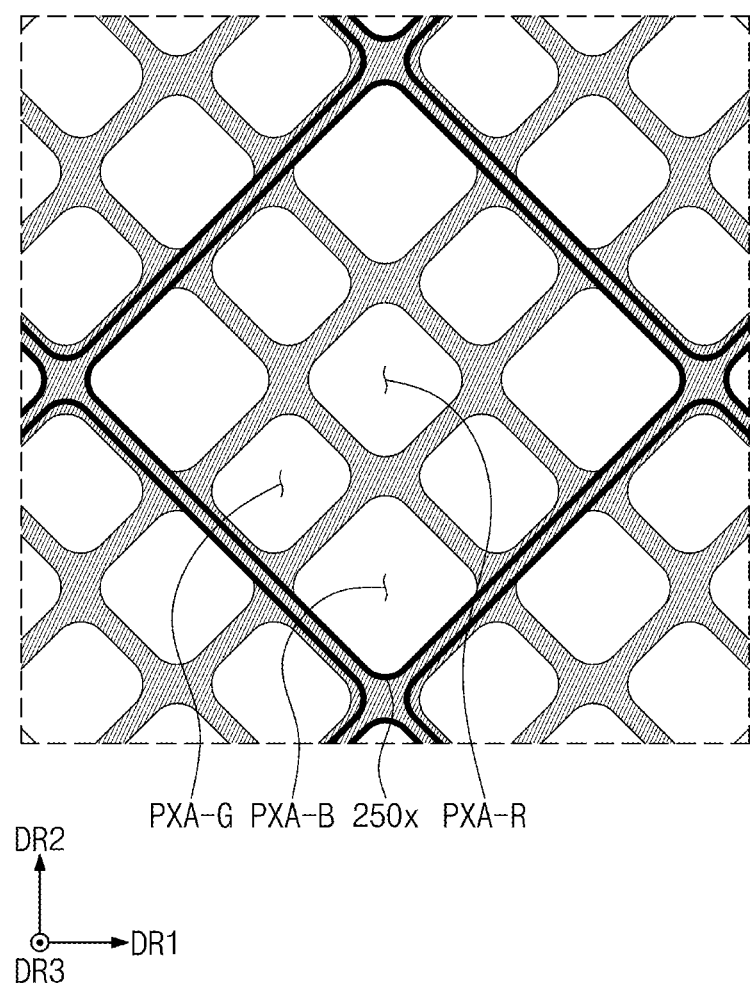
FIG. 14 is an enlarged plan view of another exemplary embodiment of the input sensing panel illustrating a partial configuration of a display device.

FIG. 14 is an enlarged plan view of another exemplary embodiment of the input sensing panel illustrating a partial configuration of a display device. In FIG. 14, a plurality of light emitting areas PXA-R, PXA-G, and PXA-B and a plurality of lens patterns 250x are illustrated as an example. Each of the plurality of lens patterns 250x illustrated in FIG. 14 indicates a portion defined by the boundary in which a bottom surface of a groove and a side surface of the groove are in contact with each other.

In an exemplary embodiment, each of the plurality of lens patterns 250x may overlap n light emitting areas of the plurality of light emitting areas (where, n is a positive number of 1 or greater). For example, one lens pattern 250x may overlap the plurality of light emitting areas PXA-R, PXA-G, and PXA-B.

The plurality of light emitting areas PXA-R, PXA-G, and PXA-B may include a first light emitting area PXA-R, a second light emitting area PXA-G, and a third light emitting area PXA-B. The surface areas of the first to third light emitting areas PXA-R, PXA-G, and PXA-B may be different from each other on a plane. Alternatively, the surface areas of the first to third light emitting areas PXA-R, PXA-G, and PXA-B may be equal to each other, but the positional relationship between the first to third light emitting areas PXA-R, PXA-G, and PXA-B is not limited to the exemplary embodiment illustrated in FIG. 14.

Figure 15:
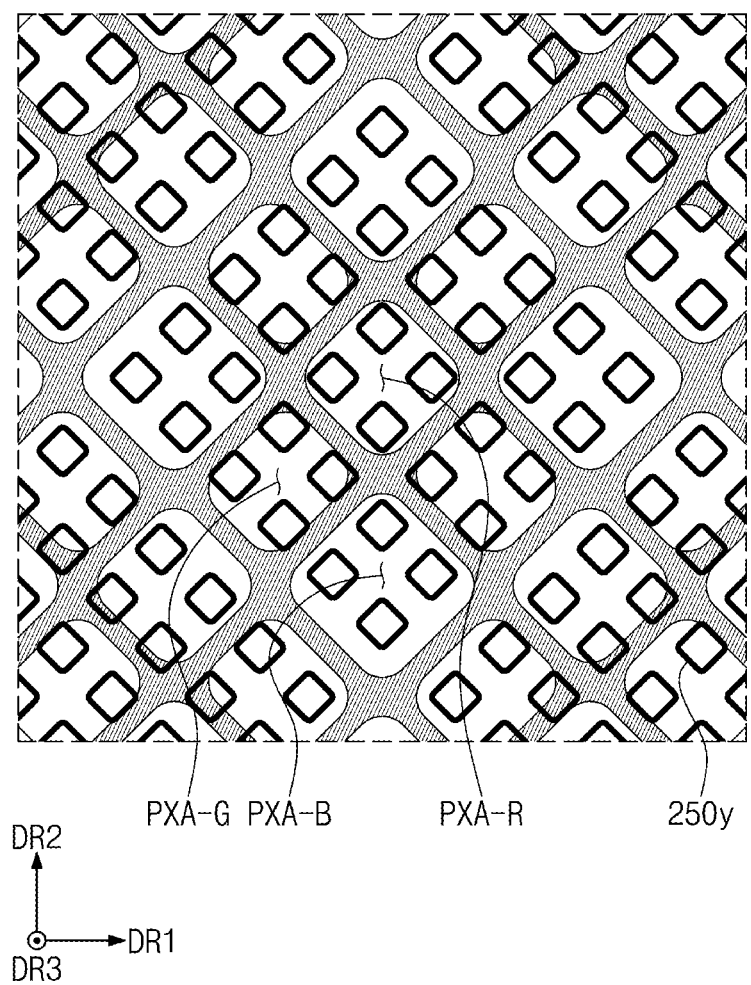
FIG. 15 is an enlarged plan view of another exemplary embodiment of the input sensing panel illustrating a partial configuration of a display device.

FIG. 15 is an enlarged plan view of another exemplary embodiment of the input sensing panel illustrating a partial configuration of a display device.

In FIG. 15, a plurality of light emitting areas PXA-R, PXA-G, and PXA-B and a plurality of lens patterns 250y are illustrated as an example.

In an exemplary embodiment, each of the plurality of light emitting areas PXA-R, PXA-G, and PXA-B may overlap m lens patterns of the plurality of lens patterns 250y (where, m is a positive number of 1 or greater). For example, at least one of the plurality of light emitting areas PXA-R, PXA-G, and PXA-B may overlap the plurality of lens patterns 250y.

In another exemplary embodiment, one lens pattern and one light emitting area may be disposed in one-to-one correspondence. Also, the lens patterns are illustrated as being regularly arranged in FIGS. 14 and 15, but, alternatively, the lens patterns may be irregularly arranged.

Figure 16:
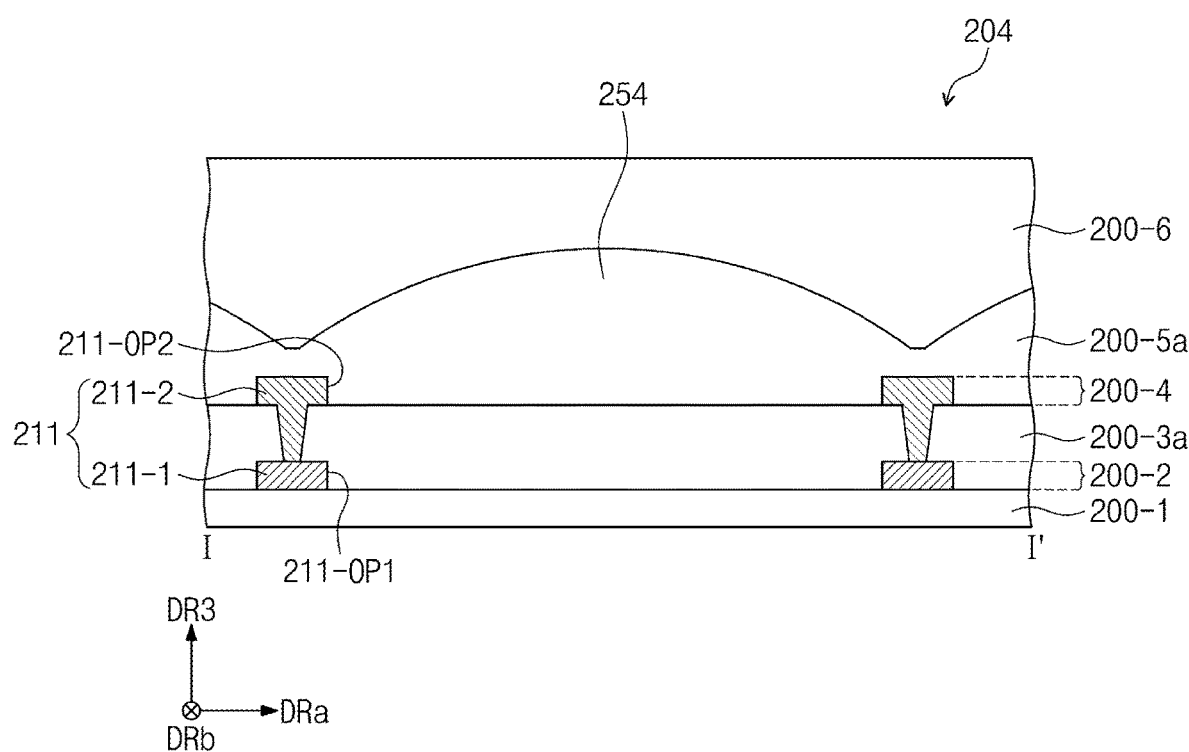
FIG. 16 is a cross-sectional view of another exemplary embodiment of the input sensing panel taken along line I-I' of FIG. 6.

FIG. 16 is a cross-sectional view of another exemplary embodiment of the input sensing panel taken along line I-I' of FIG. 6.

Referring to FIG. 16, the input sensing panel 204 may include a base insulating layer 200-1, a first conductive layer 200-2, a first insulating layer 200-3a, a second conductive layer 200-4, a second insulating layer 200-5a, and a third insulating layer 200-6.

The second insulating layer 200-5a may include a plurality of lens patterns 254. Each of the plurality of lens patterns 254 may protrude in a direction away from the base insulating layer 200-1. The plurality of lens patterns 254 may have convex lens shapes in a cross-sectional view. For example, the plurality of lens patterns 254 may substantially entirely cover the second sensing pattern layer 211-2.

The third insulating layer 200-6 may cover the second insulating layer 200-5a. The refractive index of the third insulating layer 200-6 may be greater than the refractive index of the second insulating layer 200-5a.

Figure 17A:
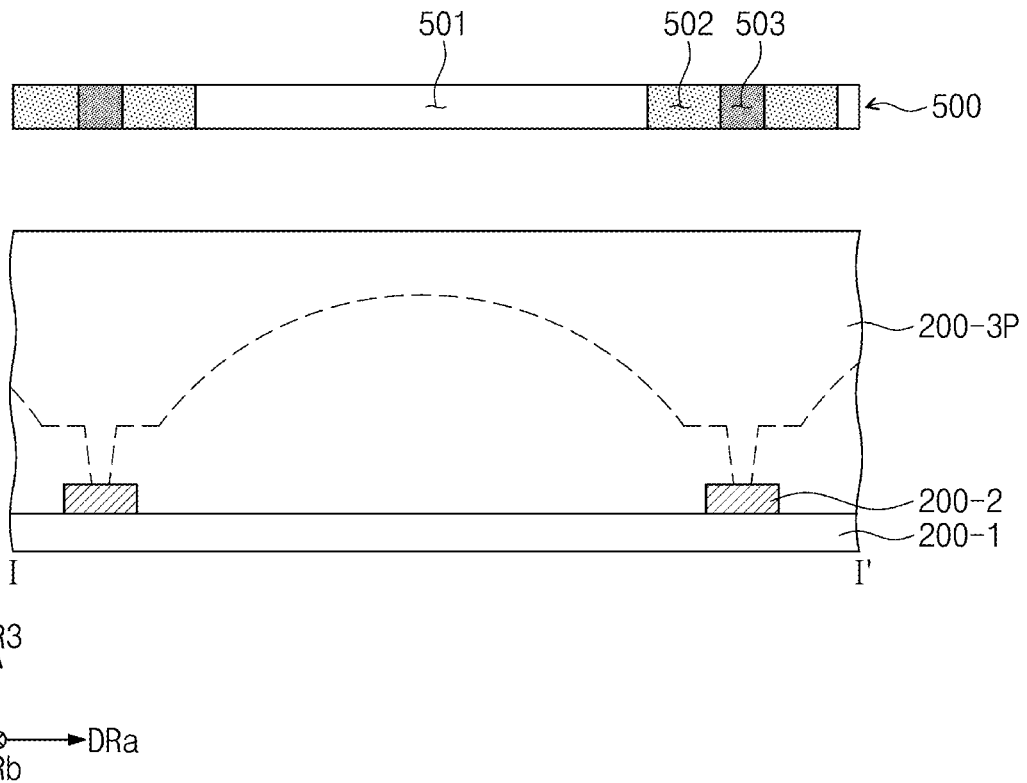
FIGS. 17A, 17B, and 17C are cross-sectional views illustrating an exemplary method of manufacturing an input sensing panel according to the principles of the invention.
Figure 17B:
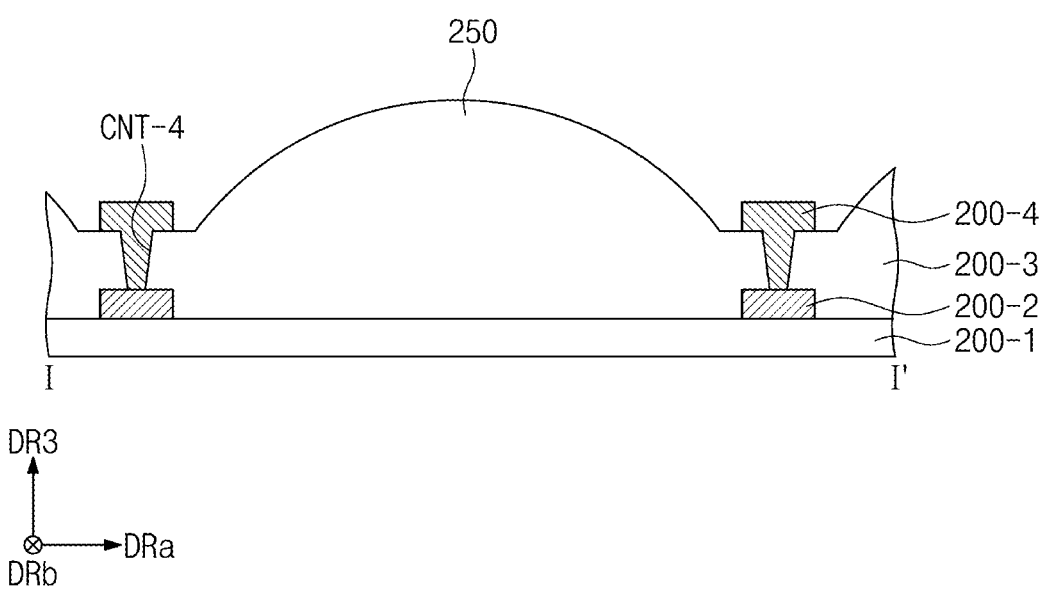
Figure 17C:
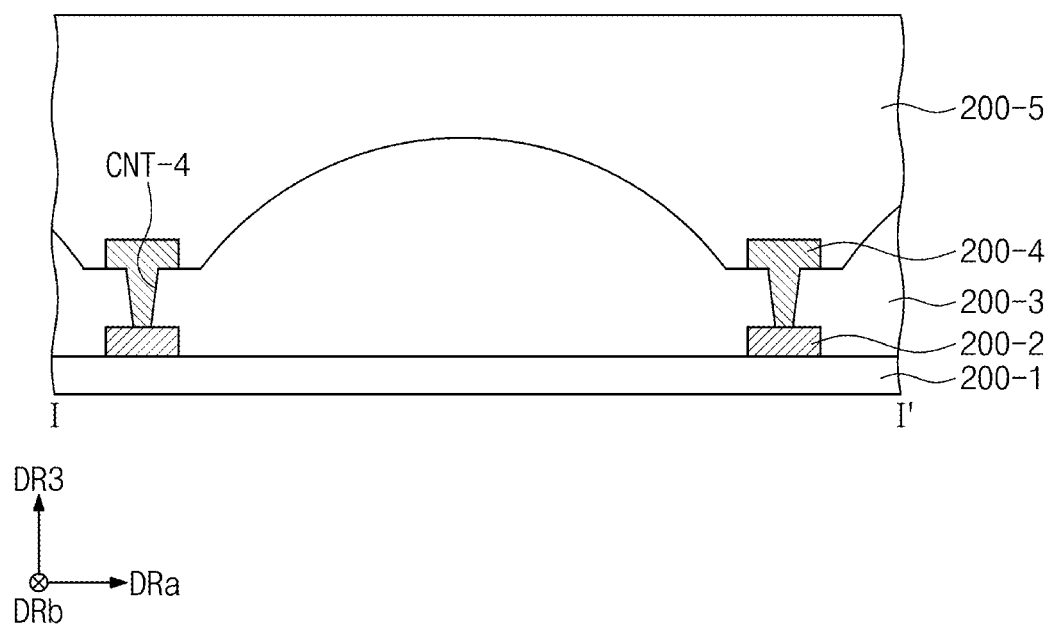

FIGS. 17A, 17B, and 17C are cross-sectional views illustrating an exemplary method of manufacturing an input sensing panel according to the principles of the invention.

Referring to FIG. 17A, a base insulating layer 200-1 may be formed. The base insulating layer 200-1 may be formed directly on the display panel 100 of FIG. 2. Alternatively, the base insulating layer 200-1 may be omitted.

Subsequently, a first conductive layer 200-2 may be formed on the base insulating layer 200-1. A preliminary insulating layer 200-3P is formed to cover the first conductive layer 200-2. The preliminary insulating layer 200-3P may be formed of a photosensitive material.

A mask 500 is disposed above the preliminary insulating layer 200-3P. The mask 500 may be a half tone mask which includes a transmissive area 501, a translucent area 502, and a light blocking area 503.

Referring to FIGS. 17A and 17B, the preliminary insulating layer 200-3P is patterned, and thus a lens pattern 250 and a contact hole CNT-4 may be formed. The patterning may include a light exposure process and a development process. According to an exemplary embodiment, the lens pattern 250 may be formed through the same process as a process of forming the contact hole CNT-4. Thus, an additional separate process may not be necessary.

Subsequently, a second conductive layer 200-4 may be formed. The second conductive layer 200-4 is in contact with the first conductive layer 200-2 exposed through the contact hole CNT-4, and thus may be electrically connected to the first conductive layer 200-2.

Referring to FIG. 17C, a second insulating layer 200-5 is formed to cover a first insulating layer 200-3 and the second conductive layer 200-4.

Figure 18:
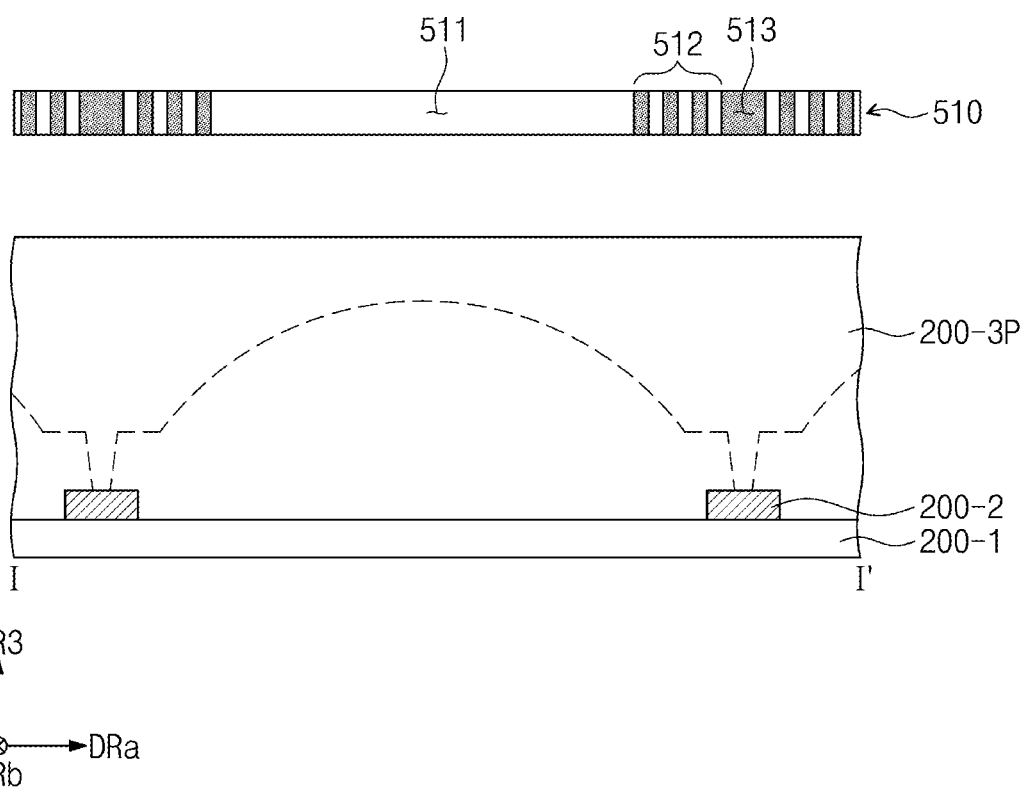
FIG. 18 is a cross-sectional view illustrating another exemplary method of manufacturing an input sensing panel according to the principles of the invention.

FIG. 18 is a cross-sectional view illustrating another exemplary method of manufacturing an input sensing panel according to the principles of the invention.

Referring to FIG. 18, a mask 510 is disposed above the preliminary insulating layer 200-3P. The mask 510 may be a slit mask 510 which includes a transmissive area 511, a slit area 512, and a light blocking area 513. The lens pattern 250 of FIG. 17B and the contact hole CNT-4 of FIG. 17B may be formed in the same process by the slit mask 510.

According to the illustrated exemplary embodiments, the insulating layer of the input sensing panel is used to define a lens pattern, and since a separate layer is not added, the flexibility of the input sensing panel is not deteriorated. Also, during the process of forming the contact hole in the insulating layer, the lens pattern may be simultaneously formed. Thus, the additional mask is unnecessary, and the process may be simplified.

Also, according to the illustrated exemplary embodiments, the light provided from the display panel is refracted by the lens pattern, and thus the optical path may change. As a result, the color variation according to the viewing angle is reduced, and thus the display quality may be enhanced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel having a plurality of light emitting areas; and
an input sensor disposed directly on the display panel and including a first conductive layer and a first insulating layer disposed on the first conductive layer,
wherein the first insulating layer comprises a plurality of optical patterns comprising a plurality of lens patterns that extend in a direction away from the first conductive layer, the plurality of lens patterns comprising a plurality of first grooves and a plurality of second grooves defined in the first insulating layer,
wherein the plurality of first grooves extend in a first direction and are spaced apart from each other in a second direction intersecting the first direction, and
wherein the plurality of second grooves extend in the second direction and are spaced apart from each other in the first direction.

2. The display device of claim 1, wherein each of the plurality of optical patterns overlaps n light emitting areas of the plurality of light emitting areas, where n is a positive number of 1 or greater.

3. The display device of claim 1, wherein each of the plurality of light emitting areas overlaps m optical patterns of the plurality of optical patterns, where m is a positive number of 1 or greater.

4. The display device of claim 1, wherein, when viewed in plan, the plurality of first grooves and the plurality of second grooves intersect each other.

5. The display device of claim 1, wherein, when viewed in plan, the plurality of first grooves and the plurality of second grooves are spaced apart from and do not overlap each other.

6. The display device of claim 1, wherein each groove of the plurality of first grooves and the plurality of second grooves comprises a bottom surface and a side surface extending from the bottom surface in the direction away from the first conductive layer to define the plurality of lens patterns.

7. The display device of claim 1, wherein each groove of the plurality of first grooves and the plurality of second grooves comprises a bottom line and a side surface extending from the bottom line in the direction away from the first conductive layer to define the plurality of lens patterns.

8. The display device of claim 1, wherein each groove of the plurality of first grooves and the plurality of second grooves has a depth less than a maximum thickness of the first insulating layer.

9. The display device of claim 1, wherein each of the plurality of optical patterns has a height greater than or equal to a maximum thickness of the first insulating layer.

10. The display device of claim 1, wherein:
the first conductive layer comprises a sensing pattern having a plurality of openings, and
when viewed in plan, each of the plurality of openings overlaps at least one optical pattern of the plurality of optical patterns.

11. The display device of claim 1, wherein the input sensor further comprises a second conductive layer disposed on the first insulating layer and a second insulating layer disposed on the second conductive layer,
wherein the second insulating layer has a refractive index greater than a refractive index of the first insulating layer.

12. The display device of claim 1, wherein the first insulating layer comprises an organic layer.

13. The display device of claim 1, wherein the input sensor further comprises a second conductive layer disposed on the first conductive layer, and
the plurality of optical patterns cover substantially an entire surface of the second conductive layer.

14. The display device of claim 1, wherein the first conductive layer is disposed on a base surface, the plurality of optical patterns are spaced apart from each other, and a portion of the base surface is exposed in an area between the plurality of optical patterns.

15. The display device of claim 1, wherein the first insulating layer further comprises a lower insulating layer disposed below the plurality of optical patterns.

16. The display device of claim 15, wherein the plurality of optical patterns are spaced apart from each other, and a portion of the lower insulating layer is exposed in an area between the plurality of optical patterns.

17. The display device of claim 15, wherein the plurality of optical patterns are adjacent to each other.

18. The display device of claim 1, wherein the display panel comprises a base layer, a circuit element layer disposed on the base layer, a display element layer disposed on the circuit element layer, and an encapsulation layer disposed on the display element layer,
wherein the input sensor further comprises a base insulating layer in direct contact with the encapsulation layer, and
wherein the first conductive layer is disposed on the base insulating layer.

19. A display device comprising:
a display panel; and
an input sensor disposed directly on the display panel, wherein the input sensor comprises:

a first conductive layer disposed on the display panel and defining a plurality of openings;

an organic layer disposed on the first conductive layer, the organic layer comprising a contact hole exposing a portion of the first conductive layer and a plurality of optical patterns having curved upper surfaces;

a second conductive layer disposed on the organic layer and electrically connected to the first conductive layer through the contact hole; and a cover layer to cover the second conductive layer, the cover layer being disposed on the organic layer and having a refractive index greater than a refractive index of the organic layer.

20. The display device of claim 19, wherein, when viewed in plan, each of the plurality of openings of the first conductive layer overlaps at least one optical pattern of the plurality of optical patterns.

21. The display device of claim 19, wherein a groove is formed in the organic layer between the plurality of optical patterns, and the groove has a depth less than or equal to a maximum thickness of the organic layer.

22. The display device of claim 19, wherein the first conductive layer is disposed on a base surface, and a portion of the cover layer is in contact with the base surface.

\* \* \* \* \*